(12) United States Patent
Kinoshita et al.

(10) Patent No.: US 12,707,884 B2
(45) Date of Patent: Aug. 11, 2026

(54) OPTICAL SEMICONDUCTOR DEVICE, METHOD FOR MANUFACTURING SAME, SOLID-STATE IMAGING DEVICE, AND ELECTRONIC DEVICE

(71) Applicant: KANEKA CORPORATION, Osaka (JP)

(72) Inventors: Daiki Kinoshita, Settsu (JP); Yuta Saito, Settsu (JP); Kenta Kuroda, Settsu (JP)

(73) Assignee: KANEKA CORPORATION, Osaka (JP)

( * ) Notice: Subject to any disclaimer, the term of this patent is extended or adjusted under 35 U.S.C. 154(b) by 417 days.

(21) Appl. No.: 18/283,682

(22) PCT Filed: Mar. 29, 2022

(86) PCT No.: PCT/JP2022/015715
§ 371 (c)(1),
(2) Date: Sep. 22, 2023

(87) PCT Pub. No.: WO2022/210798
PCT Pub. Date: Oct. 6, 2022

(65) Prior Publication Data
US 2024/0206322 A1 Jun. 20, 2024

(30) Foreign Application Priority Data
Mar. 29, 2021 (JP) ................................ 2021-054899

(51) Int. Cl.
*H10K 85/40* (2023.01)
*H10K 39/32* (2023.01)
(Continued)

(52) U.S. Cl.
CPC ............ *H10K 85/40* (2023.02); *H10K 39/32* (2023.02); *H10K 39/38* (2023.02); *H10K 85/654* (2023.02)

(58) Field of Classification Search
CPC ...... H10K 85/40; H10K 85/654; H10K 39/32; H10K 39/38
(Continued)

(56) References Cited

U.S. PATENT DOCUMENTS

2004/0164981 A1 8/2004 Fujita et al.
2017/0227811 A1 8/2017 Oda

FOREIGN PATENT DOCUMENTS

JP 2004296453 A 10/2004
JP 2006040424 A * 2/2006
(Continued)

OTHER PUBLICATIONS

Jia, Y. et al. "Thermal and Mechanical Analysis of Imaging Ball Grid Arry Image Sensor Package," 2019 IEEE 21st Electronics Packaging Technology Conference (EPTC), Singapore, Dec. 4, 2019, 6 pages.
(Continued)

*Primary Examiner* — Phuc T Dang
(74) *Attorney, Agent, or Firm* — Alleman Hall LLP

(57) ABSTRACT

An optical semiconductor device includes a semiconductor substrate provided with a light receiving element; a transparent substrate facing a surface of the semiconductor substrate on which the light receiving element is provided; and an adhesive layer that bonds the semiconductor substrate and the transparent substrate. The adhesive layer is provided so as to surround the light receiving element. The adhesive layer has a refractive index of 1.60 or less.

17 Claims, 9 Drawing Sheets

(51) Int. Cl.
*H10K 39/38* (2023.01)
*H10K 85/60* (2023.01)

(58) Field of Classification Search
USPC .......................................................... 257/40
See application file for complete search history.

(56) References Cited

FOREIGN PATENT DOCUMENTS

| | | | | | |
|---|---|---|---|---|---|
| JP | 2015089951 | A | | 5/2015 | |
| JP | 2015170638 | A | | 9/2015 | |
| JP | 20173947 | A | | 1/2017 | |
| JP | 2020024984 | A | | 2/2020 | |
| KR | 20110015820 | A | * | 2/2011 | ......... H10K 59/1213 |
| KR | 20180025182 | A | * | 3/2018 | ........... G09G 3/3233 |
| WO | WO-2009008106 | A1 | * | 1/2009 | ....... H01L 27/14683 |

OTHER PUBLICATIONS

International Bureau of WIPO, International Preliminary Report on Patentability Issued in Application No. PCT/JP2022/015715, Mar. 29, 2022, WIPO, 7 pages.

* cited by examiner

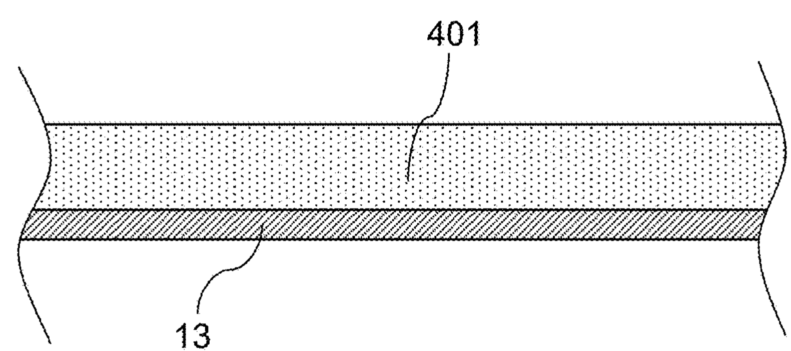
FIG. 9A
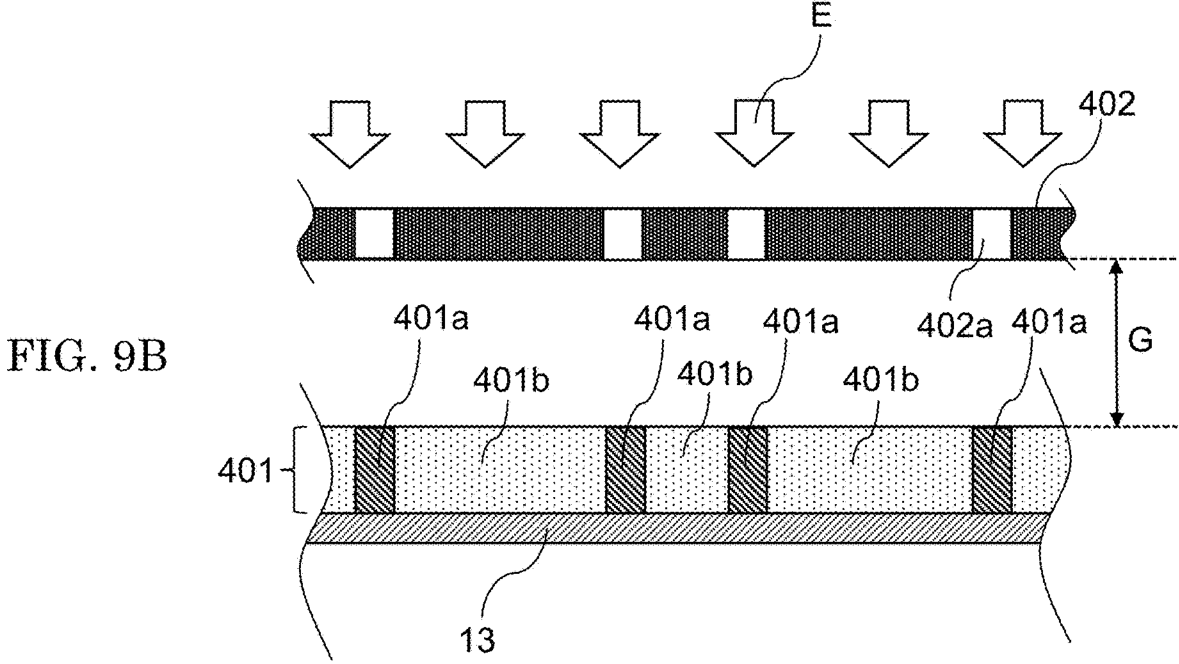
FIG. 9B
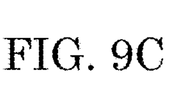
FIG. 9C
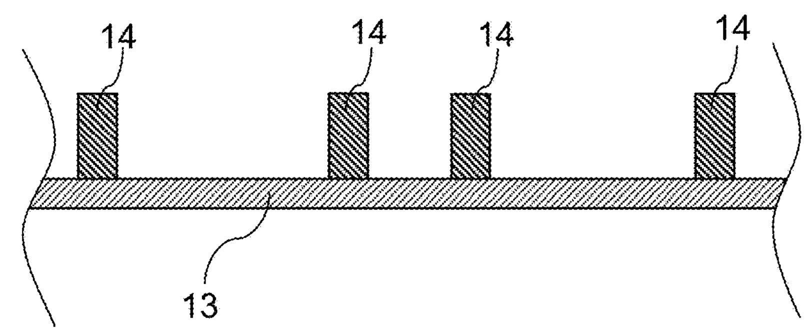

19
13
14
16
12a
11
15
12b
17
18
12

19
13
14
16
12a
11
15
12b
17
18
12

10
Z
19
12a
13
11
14
20
16
15
12b
17
21
18
12

OPTICAL SEMICONDUCTOR DEVICE, METHOD FOR MANUFACTURING SAME, SOLID-STATE IMAGING DEVICE, AND ELECTRONIC DEVICE

TECHNICAL FIELD

The present invention relates to an optical semiconductor device, a method for manufacturing the optical semiconductor device, a solid-state imaging device, and an electronic device.

BACKGROUND ART

Optical semiconductor devices for forming image sensors such as complementary metal-oxide semiconductor (CMOS) sensors and charge-coupled device (CCD) sensors are used in digital cameras, smartphones and the like, and in recent years, the image sensors have been increasingly used and increasingly required to have a smaller size and higher definition along with the popularization of monitoring cameras in automobiles and factories.

An optical semiconductor device has, for example, a hollow structure in which a semiconductor substrate provided with a light receiving element and a glass substrate are bonded to each other with an adhesive. An optical semiconductor device having a hollow structure is obtained by, for example, applying a liquid adhesive such as an epoxy resin or an acrylic resin to a peripheral edge on a semiconductor substrate, installing a glass substrate as a sealing substrate, and then performing heating to cure the liquid adhesive (see, for example, Non-Patent Document 1).

PRIOR ART DOCUMENT

Non-Patent Document

Non-Patent Document 1: 21st Electronics Packaging Technology Conference, 2019, p. 560-565

SUMMARY OF THE INVENTION

Problems to be Solved by the Invention

However, as optical semiconductor devices have been required to have a smaller size and higher definition in recent years, there have been cases where imaging characteristics are affected in conventional optical semiconductor devices such as that described in Non-Patent Document 1. In particular, there has been found to be a problem that when intense light is incident, optical noise (specifically, flares, ghosts and the like) is generated in formed images, so that expected imaging characteristics cannot be sufficiently exhibited.

The present invention has been made in view of the above-described problems, and an object of the present invention is to provide an optical semiconductor device which can suppress generation of optical noise, a method for manufacturing the optical semiconductor device, and a solid-state imaging device and an electronic device including the optical semiconductor device.

Means for Solving the Problems

An optical semiconductor device according to the present invention includes a semiconductor substrate provided with a light receiving element, a transparent substrate facing a surface of the semiconductor substrate on which the light receiving element is provided, and an adhesive layer that bonds the semiconductor substrate and the transparent substrate. The adhesive layer is provided so as to surround the light receiving element. The adhesive layer has a refractive index of 1.60 or less.

In an optical semiconductor device according to an embodiment of the present invention, an angle formed by a surface of the transparent substrate on the semiconductor substrate side and an inner wall surface of the adhesive layer is 90° or more and 130° or less.

In an optical semiconductor device according to an embodiment of the present invention, a height of the adhesive layer is 15 μm or more and 300 μm or less.

In an optical semiconductor device according to an embodiment of the present invention, the optical semiconductor device further includes a wiring substrate provided on the semiconductor substrate on a side opposite to the transparent substrate.

In an optical semiconductor device according to an embodiment of the present invention, the semiconductor substrate is provided with an electrode pad, and the adhesive layer is disposed between the electrode pad and the light receiving element.

In an optical semiconductor device according to an embodiment of the present invention, the optical semiconductor device is chip size package type.

In an optical semiconductor device according to an embodiment of the present invention, the adhesive layer includes a cured layer including a cured product of a photosensitive composition.

In an optical semiconductor device according to an embodiment of the present invention, the photosensitive composition contains a polysiloxane compound and a photopolymerization initiator, and the polysiloxane compound has a cationically polymerizable group and an alkali-soluble group in one molecule.

In an optical semiconductor device according to an embodiment of the present invention, the cationically polymerizable group is one or more selected from the group consisting of a glycidyl group, an alicyclic epoxy group and an oxetanyl group.

In an optical semiconductor device according to an embodiment of the present invention, the alkali-soluble group is one or more selected from the group consisting of a monovalent organic group represented by the following chemical formula X1 and a divalent organic group represented by the following chemical formula X2.

(X1)

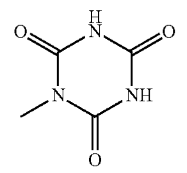

(X2)

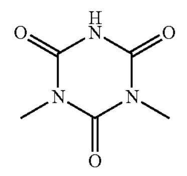

In an optical semiconductor device according to an embodiment of the present invention, the photosensitive composition further contains a compound having a radically polymerizable group, and contains a photoradical polymerization initiator as the photopolymerization initiator.

A solid-state imaging device according to the present invention includes the optical semiconductor device according to the present invention.

An electronic device according to the present invention includes the solid-state imaging device according to the present invention.

A method for manufacturing an optical semiconductor device according to the present invention includes an adhesive layer forming step, a lamination step and a curing step. In the adhesive layer forming step, a patterned adhesive layer is formed on a transparent substrate. In the lamination step, the transparent substrate on which the adhesive layer is formed and a semiconductor substrate provided with a light receiving element are laminated in such a manner that a surface of the transparent substrate on which the adhesive layer is formed and a surface of the semiconductor substrate on which the light receiving element is provided face each other. In the curing step, the adhesive layer is cured to bond the transparent substrate and the semiconductor substrate. In the method for manufacturing an optical semiconductor device according to the present invention, the adhesive layer is disposed on the periphery of the light receiving element in the lamination step. The refractive index of the cured adhesive layer is 1.60 or less.

In a method for manufacturing an optical semiconductor device according to an embodiment of the present invention, in the adhesive layer forming step, a film formed of a photosensitive composition is patterned in a semi-cured state by photolithography.

In a method for manufacturing an optical semiconductor device according to an embodiment of the present invention, in the adhesive layer forming step, the film formed of the photosensitive composition is exposed through blue plate glass, and then the exposed film is developed.

In a method for manufacturing an optical semiconductor device according to an embodiment of the present invention, the photosensitive composition contains a polysiloxane compound, a photoradical polymerization initiator, and a compound having a radically polymerizable group. The polysiloxane compound has a cationically polymerizable group and an alkali-soluble group in one molecule.

Effects of the Invention

According to the present invention, it is possible to provide an optical semiconductor device which can suppress generation of optical noise, a method for manufacturing the optical semiconductor device, and a solid-state imaging device and an electronic device including the optical semiconductor device.

BRIEF DESCRIPTION OF THE DRAWINGS

FIGS. 9A, 9B, and 9C are step-by-step sectional views showing an example of an adhesive layer forming step in manufacture of an optical semiconductor device according to the present invention.

MODE FOR CARRYING OUT THE INVENTION

Figure 1:
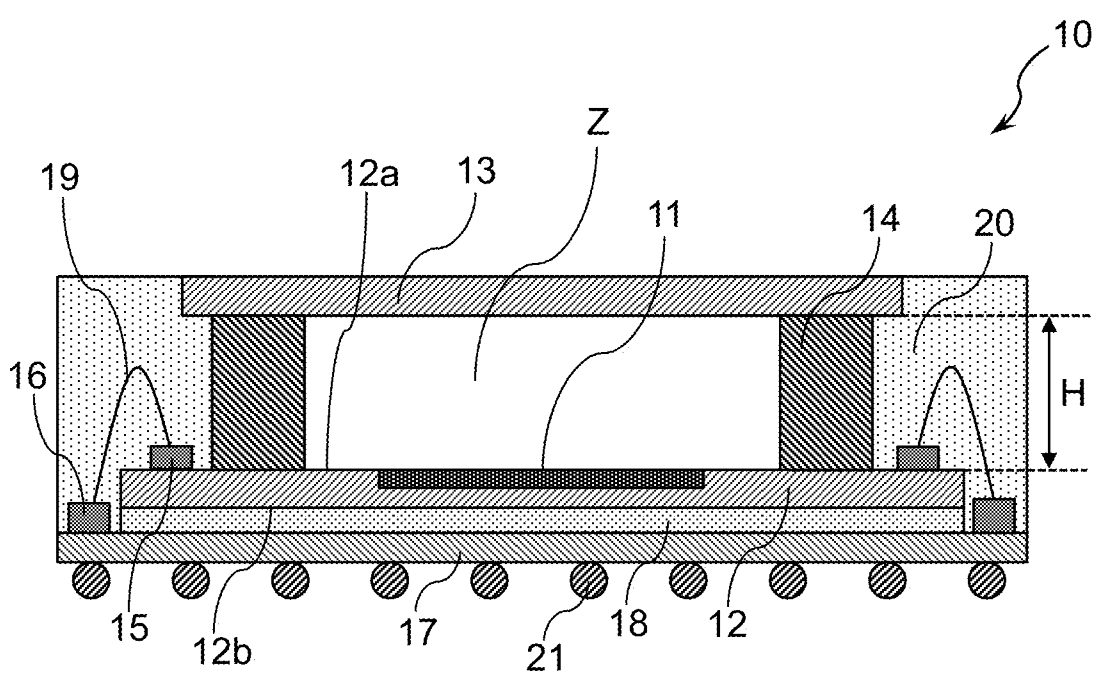
FIG. 1 is a sectional view showing an example of an optical semiconductor device according to the present invention.

Preferred embodiments of the present invention will be described in detail below, but the present invention is not limited to these embodiments. The academic documents and patent documents mentioned herein are incorporated herein by reference in their entirety.

First, terms used herein will be described. The term "refractive index" refers to a refractive index for light having a wavelength of 404 nm in an atmosphere at a temperature of 23° C. The method for measuring the refractive index is identical or similar to the method in examples described later.

The "polysiloxane compound" is a compound having a polysiloxane structure having a siloxane unit (Si—O—Si) as a constituent element. Examples of the polysiloxane structure include chain polysiloxane structures (specifically, linear polysiloxane structures, branched polysiloxane structures and the like) and cyclic polysiloxane structures. The term "photopolymerization initiator" refers to a compound that generates an active species (specifically, radical, cation, anion or the like) when irradiated with an active energy ray. The term "photoradical polymerization initiator" refers to a compound that generates a radical as an active species when irradiated with an active energy ray. The term "photocationic polymerization initiator" refers to a compound that generates a cation (acid) as an active species when irradiated with an active energy ray. Examples of the active energy ray include visible light rays, ultraviolet rays, infrared rays, electron beams, X-rays, α-rays, β-rays, and γ-rays.

The term "cationically polymerizable group" refers to a functional group that polymerizes in a chain reaction in the presence of a cation. The term "alkali-soluble group" refers to a functional group that enhances solubility in an alkaline solution by interacting with an alkali or reacting with an alkali. The term "alicyclic epoxy group" refers to a functional group formed by bonding one oxygen atom to two adjacent carbon atoms among carbon atoms forming an alicyclic structure, and examples thereof include a 3,4-epoxycyclohexyl group. The term "radically polymerizable group" refers to a functional group having a radically polymerizable unsaturated bond. The term "solid content" is a nonvolatile component in the composition, and the term "total solid content" means the total amount of composition constituent components excluding solvents.

Hereinafter, the name of a compound may be followed by the term "-based" to collectively refer to the compound and derivatives thereof. The term "-based" following the name of a compound to express the name of a polymer means that repeating units of the polymer are derived from the compound or a derivative thereof. Acryl and methacryl may be collectively referred to as "(meth)acryl." Acrylate and methacrylate may be collectively referred to as "(meth)acrylate." Acryloyl and methacryloyl may be collectively referred to as "(meth)acryloyl." The cured adhesive layer may be referred to simply as an "adhesive layer."

Unless otherwise specified, one of the components, functional groups, and the like shown in the present description may be used alone, or two or more thereof may be used in combination.

In the drawings that are referred to in the following description, mainly relevant components are schematically shown for easy understanding, and the size, the number, the shape, and the like of each illustrated component may be different from the actual counterparts for convenience of preparing the drawings. For convenience of description, there may be cases where in the drawings that are described later, the same component parts as those in the drawings described previously are given the same symbols, and descriptions thereof are omitted.

First Embodiment: Optical Semiconductor Device

An optical semiconductor device according to a first embodiment of the present invention includes a semiconductor substrate provided with a light receiving element, a transparent substrate facing a surface of the semiconductor substrate, which is provided with the light receiving element, and an adhesive layer that bonds the semiconductor substrate and the transparent substrate. The adhesive layer is provided so as to surround the light receiving element. The refractive index of the adhesive layer is 1.60 or less.

The optical semiconductor device according to the first embodiment can suppress generation of optical noise. The reason for this is presumed as follows.

In the optical semiconductor device according to the first embodiment, the light reflectance of the surface of the adhesive layer (specifically, the inner wall surface of the adhesive layer) is relatively low because the refractive index of the adhesive layer is 1.60 or less. For this reason, in the optical semiconductor device according to the first embodiment, the amount of reflected light (specifically, reflected light from the inner wall surface of the adhesive layer) incident to the light receiving element is relatively small, and as a result, optical noise caused by reflected light is hardly generated. Thus, the optical semiconductor device according to the first embodiment can suppress generation of optical noise.

Hereinafter, as a specific example of the optical semiconductor device according to the first embodiment, an optical semiconductor device (optical semiconductor device 10 shown in FIG. 1) further including a wiring substrate and a chip size package type optical semiconductor device (optical semiconductor device 100 shown in FIG. 3) will be described with reference to the drawings.

[Optical Semiconductor Device 10]

FIG. 1 is a sectional view showing an optical semiconductor device 10 which is a specific example of the optical semiconductor device according to the first embodiment. The optical semiconductor device 10 shown in FIG. 1 includes a semiconductor substrate 12, a transparent substrate 13, and an adhesive layer 14. A light receiving element 11 is provided on a first surface 12*a* of the semiconductor substrate 12. The optical semiconductor device 10 further includes a wiring substrate 17 (interposer) bonded to a second surface 12*b* of the semiconductor substrate 12 (a surface of the semiconductor substrate 12 on a side opposite to the transparent substrate 13) with a die bond material 18 interposed therebetween. The "first surface 12*a* of the semiconductor substrate 12" means one of two surfaces which orthogonally crosses the thickness direction of the semiconductor substrate 12. The "second surface 12*b* of the semiconductor substrate 12" means the other one of two surfaces which orthogonally crosses the thickness direction of the semiconductor substrate 12. The transparent substrate 13 is disposed so as to face the first surface 12*a* of the semiconductor substrate 12. The adhesive layer 14 bonds the semiconductor substrate 12 and the transparent substrate 13, and is provided so as to surround the light receiving element 11. The adhesive layer 14 has, for example, a quadrangular cylindrical structure (see FIG. 8).

The semiconductor substrate 12 and the wiring substrate 17 are provided with a semiconductor substrate electrode pad 15 and a wiring substrate electrode pad 16, respectively. The semiconductor substrate electrode pad 15 and the wiring substrate electrode pad 16 are electrically connected through a metallic wire 19. The adhesive layer 14 is disposed between the semiconductor substrate electrode pad 15 and the light receiving element 11, and a peripheral portion of the adhesive layer 14 (a region including the wire 19) is sealed with a sealing resin 20. A solder ball 21 (external connection terminal) is formed on a surface of the wiring substrate 17 on a side opposite to the die bond material 18.

An internal space Z surrounded by the semiconductor substrate 12, the transparent substrate 13 and the adhesive layer 14 may be a sealed space. Here, the adhesive layer 14 functions as a partition wall that prevents ingress of moisture and dust into an effective image region. In the case where ventilation holes are formed in the adhesive layer 14, ingress of foreign matter into the internal space Z can be prevented by forming the adhesive layer 14 in the shape of a maze.

When the internal space Z has an air atmosphere, the light reflectance R at the surface of the adhesive layer 14 is given by $R=(1-n1)^2/(1+n1)^2$ where the refractive index of air is 1 and the refractive index of the adhesive layer 14 is n1. Thus, as the refractive index of the adhesive layer 14 becomes lower, the light reflectance at the surface of the adhesive layer 14 decreases, and the flare is improved. Specifically, the refractive index of the adhesive layer 14 is preferably 1.60 or less, more preferably 1.55 or less, still more preferably 1.53 or less. The lower limit of the refractive index of the adhesive layer 14 is not particularly limited, and is, for example, 1.30. The refractive index of the adhesive layer 14 can be adjusted by changing the constituent material of the adhesive layer 14. For example, as described later, the refractive index of the adhesive layer 14 can be easily adjusted to 1.60 or less by using a polysiloxane compound as a constituent material of the adhesive layer 14. In addition, the refractive index of the adhesive layer 14 can be adjusted by using a filler described later as a constituent material of the adhesive layer 14.

The constituent material of the adhesive layer 14 is not particularly limited as long as it is a material that can adjust the refractive index to 1.60 or less. Examples thereof include cured products of photosensitive compositions and cured products of thermosetting resins, and cured products of photosensitive compositions are preferable from the viewpoint of ease of patterning. That is, from the viewpoint of ease of patterning, the adhesive layer 14 is preferably a cured layer including a cured product of a photosensitive composition. Among the photosensitive compositions, photosensitive compositions such as a cationically curable epoxy resin compositions and radically curable acrylic resin compositions can be used, and photosensitive compositions containing a cationically curable compound are particularly preferable from the viewpoint of adhesiveness. Details of the photosensitive composition will be described later.

For obtaining an optical semiconductor device which is excellent in reliability evaluated in a thermal shock test (hereinafter, sometimes referred to simply as "reliability") and can further suppress generation of optical noise, a height H of the adhesive layer 14 is preferably 500 μm or less, more preferably 400 μm or less, still more preferably 300 μm or less, even more preferably 150 μm or less, and may be 140 μm or less, 130 μm or less, 120 μm or less, 110 μm or less, or 100 μm or less. For obtaining an optical semiconductor device in which reflection of foreign matter adhered on the transparent substrate 13 can be suppressed, the height H of the adhesive layer 14 is preferably 10 μm or more, more preferably 12 μm or more, still more preferably 15 μm or more, even more preferably 20 μm or more, and may be 25 μm or more, or 30 μm or more.

For obtaining an optical semiconductor device which is excellent in reliability and can further suppress generation of optical noise and reflection of foreign matter, the height H of the adhesive layer 14 is preferably 15 μm or more and 300 μm or less, more preferably 20 μm or more and 150 μm or less, still more preferably 30 μm or more and 150 μm or less, even more preferably 30 μm or more and 120 μm or less, particularly preferably 30 μm or more and 100 μm or less.

For obtaining a captured image having reduced strain, the variation in height H of the adhesive layer 14 is preferably small. Specifically, the variation in height H of the adhesive layer 14 is preferably within 20%, more preferably within 10% of the average value of the heights H of the adhesive layer 14 (for example, average value of the heights H at 10 randomly selected measurement points).

When the adhesive layer 14 has a quadrangular cylindrical structure (see FIG. 8), the shape of each of the four corners of the adhesive layer 14 is preferably a curved shape. When the shape of each of the four corners of the adhesive layer 14 is a curved shape, concentration of stress on the four corners can be lessened to reduce peeling and cracking of the adhesive layer 14 during solder reflow and a thermal shock test. For further reducing peeling and cracking of the adhesive layer 14 during solder reflow and a thermal shock test, the curvature radii of the four corners of the adhesive layer 14 on the outer periphery side and the inner periphery side are each preferably 0.01 mm or more and 1.0 mm or less.

The surface of the adhesive layer 14 may have level differences in both the horizontal direction and the vertical direction such that a corrugated shape is formed. Such a shape relaxes stress during solder reflow or a thermal shock test, resulting in improvement of the reliability of the adhesive layer 14.

The width of the adhesive layer 14 is, for example, 10 μm or more and 200 μm or less, preferably 20 μm or more and 150 μm or less.

Examples of the semiconductor substrate 12 include image sensor substrates. The thickness of the semiconductor substrate 12 is, for example, 50 μm or more and 800 μm or less.

As the transparent substrate 13, for example, a glass substrate, a transparent plastic substrate (more specifically, an acrylic resin substrate, a polycarbonate substrate or the like), or the like can be used, and a glass substrate is preferable from the viewpoint of reliability. The type of glass is not particularly limited, and examples thereof include quartz glass, borosilicate glass, and alkali-free glass. The thickness of the transparent substrate 13 is, for example, 50 μm or more and 2,000 μm or less.

If necessary, a covering film functioning as any of an infrared reflection film (or an infrared cut filter), an anti-reflection film (AR coating), a non-reflective film, a protective film, a reinforcing film, a shielding film, a conductive film, an antistatic film, a low-pass filter, a high-pass filter and a band-pass filter may be formed on a surface of the transparent substrate 13. In particular, an anti-reflection film and an infrared reflection film (or an infrared cut filter) are preferable because optical noise of a captured image is reduced.

Specific examples of the covering film include single-layer thin films formed of silica ($SiO_2$), titanium oxide ($TiO_2$), alumina ($Al_2O_3$), zirconia ($ZrO_2$), tantalum oxide ($Ta_2O_5$), niobium oxide ($Nb_2O_5$), lanthanum oxide ($La_2O_3$), yttrium oxide ($Y_2O_3$), magnesium oxide (MgO), hafnium oxide ($HfO_2$), chromium oxide ($Cr_2O_3$), magnesium fluoride ($MgF_2$), molybdenum oxide ($MoO_3$), tungsten oxide ($WO_3$), cerium oxide ($CeO_2$), vanadium oxide ($VO_2$), titanium zirconium oxide ($ZrTiO_4$), zinc sulfide (ZnS), cryolite ($Na_3AlF_6$), thiolite ($NasAl_3F_{14}$), yttrium fluoride ($YF_3$), calcium fluoride ($CaF_2$), aluminum fluoride ($AlF_3$), barium fluoride ($BaF_2$), lithium fluoride (LiF), lanthanum fluoride ($LaF_3$), gadolinium fluoride ($GdF_3$), dysprosium fluoride ($DyF_3$), lead fluoride ($PbF_3$), strontium fluoride ($SrF_2$), antimony-containing tin oxide (ATO), indium tin oxide (ITO), or the like; multi-layer films such as multi-layer films of $SiO_2$ and $Al_2O_3$, $SiO_x$—$TiO_x$-based multi-layer films, $SiO_2$—$Ta_2O_5$-based multi-layer films, and $SiO_x$—$LaO_x$—$TiO_x$-based multi-layer films; solid solution films such as $In_2O_3$—$Y_2O_3$ solid solution films and alumina solid solution films; metal thin films; colloidal particle dispersion films; and resin films such as polymethyl methacrylate films (PMMA films), polycarbonate films (PC films), polystyrene films, methyl methacrylate-styrene copolymer films, and polyacrylate films.

In particular, when an anti-reflection film is used as the covering film, it is preferable to use a multi-layer film containing one or more inorganic materials selected from the group consisting of $TiO_2$, $Nb_2O_5$, $Ta_2O_5$, $CaF_2$, $SiO_2$, $Al_2O_3$, $MgS_2$, $ZrO_2$, NiO, and $MgF_2$.

The covering film can be provided on each of both surfaces or one surface of the transparent substrate 13. When the covering films are provided on both surfaces, the types of the covering films may be the same or different. Different types of covering films having the same function can also be stacked on one surface. Different types of covering films having different functions can also be stacked on one surface. The number of stacked layers is not particularly limited, and a multi-layer film having several to several tens of layers may be formed.

A plurality of photodiodes (not shown) are formed in the light receiving element 11. A color filter layer (not shown) and a microlens (not shown) are formed on the photodiode. The color filters are demarcated so as to correspond to the individual photodiodes, and colored in one of the three primary colors of light. The microlens has a hemispherical shape, and concentrate incident light on each photodiode.

The die bond material 18 is not particularly limited, and is preferably a thermosetting resin such as an epoxy resin or a silicone resin which is not significantly degraded by reflow at a temperature of about 260° C.

The wiring substrate 17 is a multi-layer wiring substrate including a glass epoxy resin base material or the like and metal wiring, and wiring and interlayer connection vias are formed on a surface of the wiring substrate and inside the wiring substrate. On a surface of the wiring substrate 17 on which the semiconductor substrate 12 is installed, the wiring substrate electrode pad 16 for connection to the semiconductor substrate electrode pad 15 on the semiconductor substrate 12 by the wire 19 is provided. A solder ball 21 which is an external connection terminal is formed on a surface of the wiring substrate 17 on a side opposite to the semiconductor substrate 12. The wiring substrate 17 also has a function as a support substrate that suppresses deformation of the semiconductor substrate 12.

The sealing resin 20 is not particularly limited, and a thermosetting resin such as an epoxy resin, an acrylic resin or a silicone resin is preferable, and an epoxy resin is preferable from the viewpoint of toughness and heat resistance of the resin. From the viewpoint of reducing optical noise such as flares, the sealing resin 20 is preferably colored in black. From the viewpoint of handleability, it is preferable that the sealing resin 20 contains a filler such as silica and has thixotropy before curing.

Figure 2:
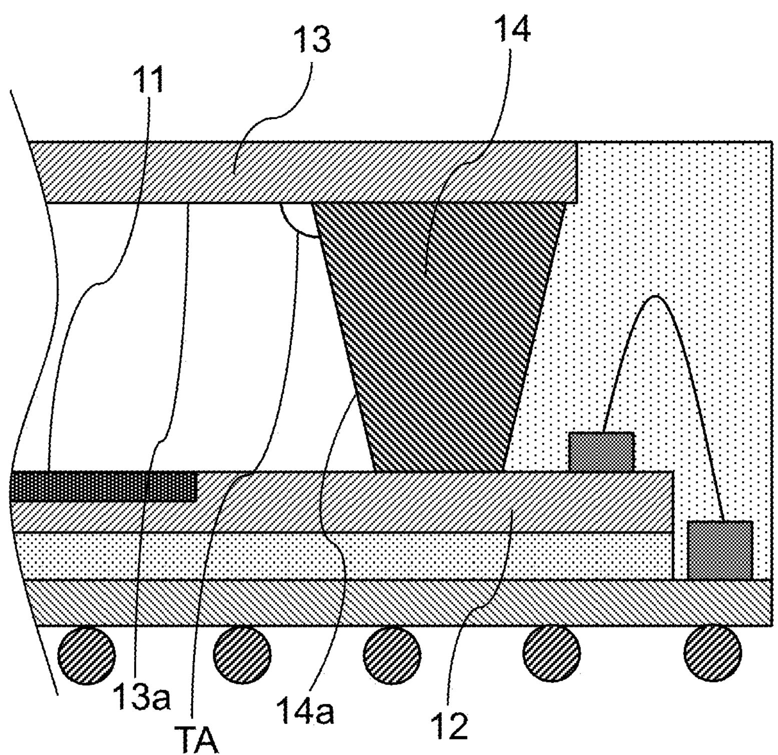
FIG. 2 is a partially enlarged sectional view showing another example of an optical semiconductor device according to the present invention.

In FIG. 1, the adhesive layer 14 has a rectangular structure in sectional view, but the cross-sectional shape of the adhesive layer 14 is not limited thereto. For example, as shown in FIG. 2, an angle TA formed by a surface 13*a* of the transparent substrate 13 on the semiconductor substrate 12 side and an inner wall surface 14*a* of the adhesive layer 14 may be more than 90°. In the following description, the degree of the angle formed by a surface of the transparent substrate on the semiconductor substrate side and the inner wall surface of the adhesive layer may be referred to as a "taper angle" (angle TA in FIG. 2).

For obtaining an optical semiconductor device which can further suppress generation of optical noise by inhibiting light incident to the adhesive layer 14 from being reflected to the light receiving element 11, the taper angle is preferably 90° or more, more preferably more than 90°, still more preferably 95° or more, even more preferably 100° or more, and may be 110° or more. For obtaining an optical semiconductor device excellent in reliability by securing a sufficient bonding area between the adhesive layer 14 and the semiconductor substrate 12, the taper angle is preferably 130° or less, more preferably 125° or less, still more preferably 120° or less.

For obtaining an optical semiconductor device which further suppresses generation of optical noise and is excellent in reliability, the taper angle is preferably 90° or more and 130° or less, more preferably 90° or more and 125° or less, still more preferably 95° or more and 125° or less, even more preferably 100° or more and 125° or less, and may be 100° or more and 120° or less, or 110° or more and 120° or less.

[Optical Semiconductor Device 100]

Next, as another specific example of the optical semiconductor device according to the first embodiment, an optical semiconductor device 100 of chip size package type (CSP type) will be described with reference to the drawings. In the following description, descriptions of contents overlapping with those of the optical semiconductor device 10 may be omitted.

Figure 3:
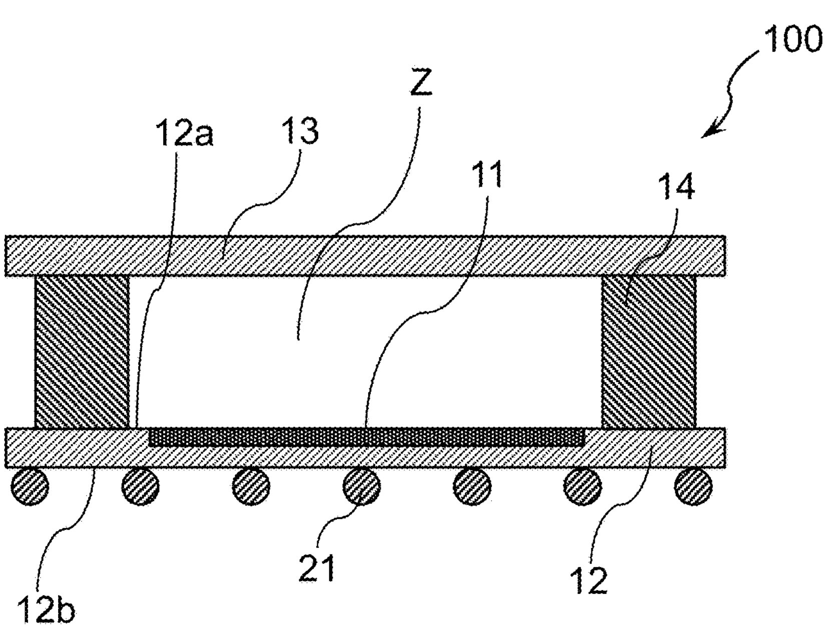
FIG. 3 is a sectional view showing another example of an optical semiconductor device according to the present invention.

FIG. 3 is a sectional view showing the optical semiconductor device 100. Like the optical semiconductor device 10, the optical semiconductor device 100 includes a semiconductor substrate 12 in which a light receiving element 11 is provided on the first surface 12*a*, the transparent substrate 13, and the adhesive layer 14 that bonds the semiconductor substrate 12 and the transparent substrate 13. In the optical semiconductor device 100, the transparent substrate 13 is disposed so as to face the first surface 12*a* of the semiconductor substrate 12 and the adhesive layer 14 is provided so as to surround the light receiving element 11 as in the optical semiconductor device 10.

Since the optical semiconductor device 100 is of CSP type, the width of the optical semiconductor device 100 is substantially equal to the width of the semiconductor substrate 12. The optical semiconductor device 100 does not require sealing with a sealing resin because it does not have a wiring substrate, a wiring substrate electrode pad, and a wire that are present in the optical semiconductor device 10. In the optical semiconductor device 100, a second surface 12*b* of the semiconductor substrate 12 is provided with the solder ball 21 which is an external connection terminal. The optical semiconductor device 100 has an advantage that the device can be downsized due to the structure of CSP type. Since optical semiconductor device 100 does not have a wiring substrate, it is necessary that separately, the semiconductor substrate 12 and the solder ball 21 be electrically connected. Hereinafter, an example of a method for electrically connecting the semiconductor substrate 12 and the solder ball 21 will be described, but the method is not limited thereto.

Figure 4:
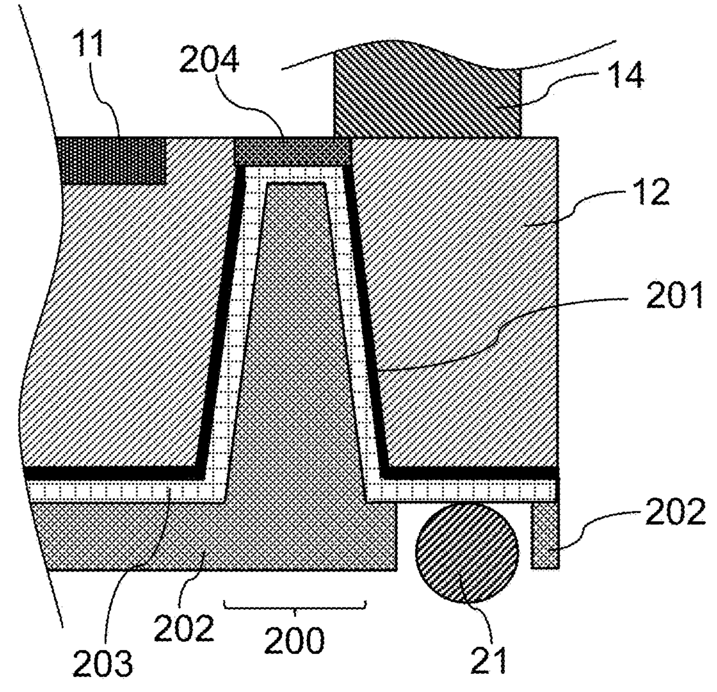
FIG. 4 is a partially enlarged sectional view showing another example of an optical semiconductor device according to the present invention.

Examples of the method for electrical connection include a method in which a through-silicon via 200 is provided as shown in FIG. 4. In the configuration of FIG. 4, an insulating layer 201, a rewiring layer 203, and a solder resist 202 are provided in this order on a surface of the semiconductor substrate 12 on a side opposite to the adhesive layer 14. The solder ball 21 is formed in an opening of the solder resist 202 and electrically connected through the rewiring layer 203 to an electrode pad 204 formed on a surface of the semiconductor substrate 12 on the adhesive layer 14 side.

The insulating layer 201 is not particularly limited as long as it is formed of a material having high insulation quality, and examples thereof include silicon oxide films ($SiO_2$ films), silicon nitride films (SiN films), silicon oxynitride films (SiON films), SiOC films, HSQ (Hydrogen Silsesquioxane) films, and MSQ (Methyl Silsesquioxane) films. Examples of the method for forming the insulating layer 201 include a chemical vapor deposition (CVD) method and a coating method.

The solder resist 202 is not particularly limited as long as it is formed of a material having heat resistance and insulation quality during mounting, and examples thereof include epoxy resins and acrylic resins. Among them, epoxy resins are preferable from the viewpoint of high heat resistance and insulation quality. Examples of the method for forming the solder resist 202 include photolithography and a screen printing method.

The material of the rewiring layer 203 is not particularly limited as long as it has conductivity, and examples thereof include copper (Cu), aluminum (Al), tungsten (W), gold (Au), titanium (Ti), and nickel (Ni). Examples of the method for forming the rewiring layer 203 include a wet etching method, a dry etching method, and a lift-off method.

Figure 5:
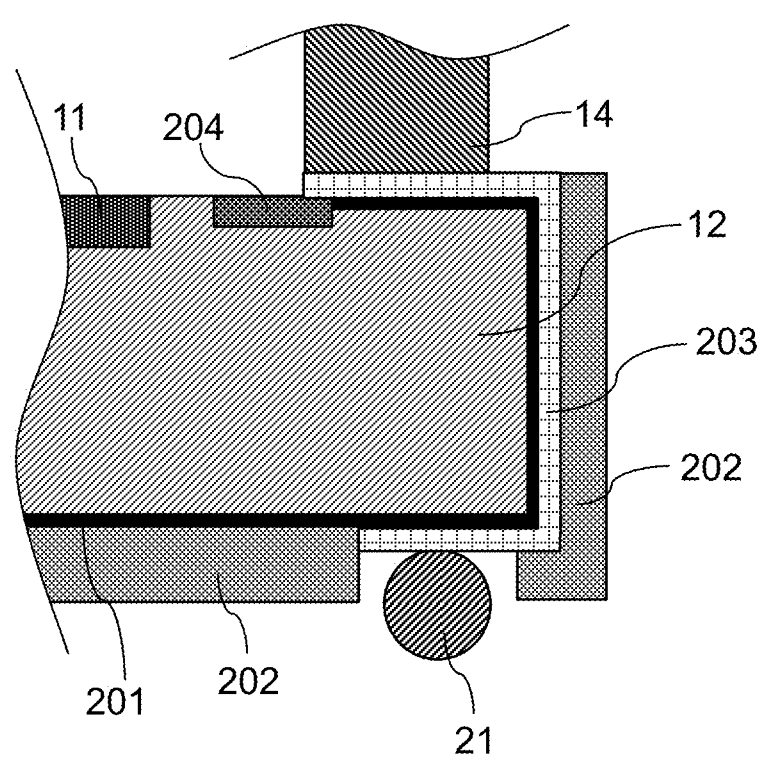
FIG. 5 is a partially enlarged sectional view showing another example of an optical semiconductor device according to the present invention.

As another example of the method for electrical connection is a method in which as shown in FIG. 5, the rewiring layer 203 is formed along the outer peripheral portion of the semiconductor substrate 12, and the solder ball 21 and the electrode pad 204 are electrically connected through the rewiring layer 203.

For the rest, the optical semiconductor device 100 is the same as described in the above section [Optical semiconductor device 10].

The configuration of the optical semiconductor device according to the first embodiment has been described above with reference to the drawings, but the present invention is not limited to the examples described above. For example, in the optical semiconductor device according to the present invention, the adhesive layer may have a laminated structure of two or more layers.

Figure 6:
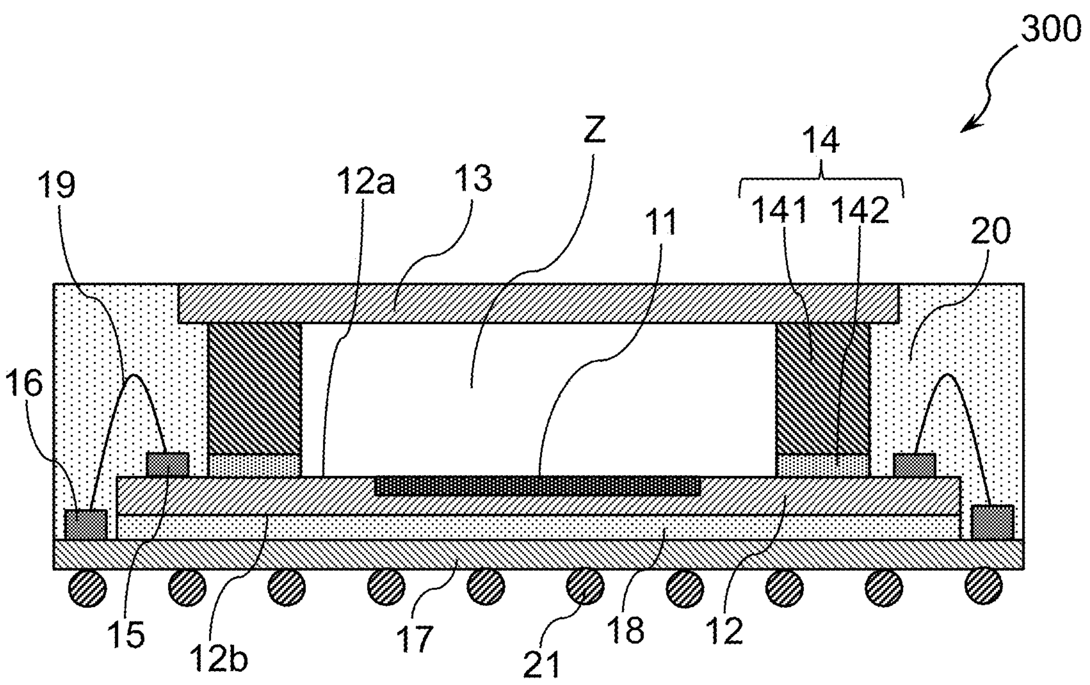
FIG. 6 is a sectional view showing another example of an optical semiconductor device according to the present invention.

Examples of the optical semiconductor device in which the adhesive layer has a laminated structure of two or more layers include an optical semiconductor device 300 shown in FIG. 6. In the optical semiconductor device 300, the adhesive layer 14 includes a first adhesive layer 141 and a second adhesive layer 142 in this order from the transparent substrate 13 side. The first adhesive layer 141 is, for example, a cured layer including a cured product of a specific photosensitive composition described later. The second adhesive layer 142 is, for example, a cured layer including a cured product of a liquid adhesive (more specifically, a cured layer formed by curing a liquid adhesive without performing patterning).

In the case of an optical semiconductor device in which the adhesive layer has a laminated structure of two or more layers, the height of the adhesive layer, as used herein, means the sum of the heights (total height) of the layers forming the adhesive layer. In the case of an optical semiconductor device in which the adhesive layer has a laminated structure of two or more layers, it is preferable that each of the layers forming the adhesive layer has a refractive index of 1.60 or less.

[Photosensitive Composition]

Next, a photosensitive composition that can be used as a material for the adhesive layer of the optical semiconductor device according to the first embodiment will be described. The photosensitive composition that can be used as a material for the adhesive layer is not particularly limited as long as it is a photosensitive composition in which when an active energy ray is applied, a photosensitive group is crosslinked by cations or radicals generated from a photopolymerization initiator, so that a curing reaction proceeds. Examples of the photosensitive group include cationically polymerizable groups such as an epoxy group, an oxetanyl group, a vinyl ether group, and an alkoxysilyl group, and radically polymerizable groups having a radically polymerizable unsaturated bond. Specific examples of the radically polymerizable group include a (meth)acryloyl group and a vinyl group. The photosensitive group-containing compound in the photosensitive composition may have both or only one of a cationically polymerizable group and a radically polymerizable group in one molecule. A compound having a cationically polymerizable group and a compound having a radically polymerizable group may be used in combination.

For forming an adhesive layer excellent in heat resistance while enabling further suppression of generation of optical noise by reducing the refractive index of the adhesive layer, it is preferable that the photosensitive contains a polysiloxane compound. Hereinafter, preferred examples of the photosensitive composition containing a polysiloxane compound will be described.

The photosensitive composition that is preferable as a material for the adhesive layer (hereinafter, sometimes referred to as a “specific photosensitive composition”) contains a polysiloxane compound having a cationically polymerizable group and an alkali-soluble group in one molecule (hereinafter, sometimes referred to as “component (A)”), and a photopolymerization initiator (hereinafter, sometimes referred to as “component (B)”).

{Component (A)}

The component (A) is not particularly limited as long as it is a polysiloxane compound having a cationically polymerizable group and an alkali-soluble group in one molecule. When the component (A) has a cationically polymerizable group and an alkali-soluble group in one molecule, a specific photosensitive composition excellent in both developability and curability can be obtained. Preferably, the component (A) has a plurality of cationically polymerizable groups in one molecule. When the component (A) has a plurality of cationically polymerizable groups in one molecule, there is a tendency that an adhesive layer having a high crosslinking density is obtained, resulting in further improvement of the heat resistance of the adhesive layer. A plurality of cationically polymerizable groups may be the same, or two or more different functional groups. Preferably, the component (A) has a plurality of alkali-soluble groups in one molecule. When the component (A) has a plurality of alkali-soluble groups in one molecule, developability tends to be further improved because non-exposed portion removability is enhanced during development. A plurality of alkali-soluble groups may be the same, or two or more different functional groups.

The component (A) may have a chain polysiloxane structure or a cyclic polysiloxane structure. For forming the adhesive layer having further excellent heat resistance, it is preferable that the component (A) has a cyclic polysiloxane structure. When the component (A) has a cyclic polysiloxane structure, the specific photosensitive composition tends to have high film formability and developability.

The component (A) may have a polysiloxane structure in the main chain or a polysiloxane structure in the side chain. For forming the adhesive layer having further excellent heat resistance, it is preferable that the component (A) has a polysiloxane structure in the main chain. For forming an adhesive layer having furthermore excellent heat resistance, it is preferable that the component (A) has a cyclic polysiloxane structure in the main chain.

The cyclic polysiloxane structure may be a monocyclic structure or a polycyclic structure. The polycyclic structure may be a polyhedral structure. An adhesive layer having high hardness and excellent heat resistance tends to be obtained when the content of T units ($XSiO_{3/2}$) or Q units ($SiO_{4/2}$) among siloxane units forming a ring is high. An adhesive layer which is more flexible and has reduced residual stress tends to be obtained when the content of M units ($X_3SiO_{1/2}$) or D units ($X_2SiO_{22}$) is high.

When the component (A) is a polymer having a polysiloxane structure in the main chain, the weight average molecular weight of the polymer is preferably 10,000 or more and 50,000 or less, and more preferably 20,000 or more and 40,000 or less. When the weight average molecular weight is 10,000 or more, the heat resistance of the obtained adhesive layer tends to be further improved. On the other hand, when the weight average molecular weight is 50,000 or less, developability tends to be further improved.

Examples of the cationically polymerizable group of the component (A) include an epoxy group, a vinyl ether group, an oxetanyl group, and an alkoxysilyl group. From the viewpoint of the storage stability of the specific photosensitive composition, the cationically polymerizable group is preferably one or more selected from the group consisting of a glycidyl group, an alicyclic epoxy group, and an oxetanyl group, more preferably one or more selected from the group consisting of a glycidyl group and an alicyclic epoxy group. Among them, an alicyclic epoxy group is particularly preferable because it is excellent in photocationic polymerizability.

Examples of the alkali-soluble group of the component (A) include monovalent organic groups represented by the following chemical formula X1 (hereinafter, sometimes referred to as an "X1 group"), divalent organic groups represented by the following chemical formula X2 (hereinafter, sometimes referred to as an "X2 group"), a phenolic hydroxyl group, and a carboxy group. The X1 group is a monovalent organic group derived from a N-mono-substituted isocyanuric acid. The X2 group is a divalent organic group derived from a N,N'-disubstituted isocyanuric acid.

Chemical Formula X1 and X2

(X1)

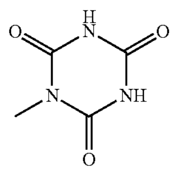

(X2)

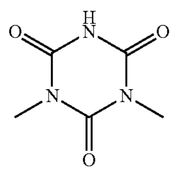

For forming an adhesive layer having further excellent heat resistance, the alkali-soluble group of the component (A) is preferably one or more selected from the group consisting of the X1 group and the X2 group.

The method for introducing the cationically polymerizable group into the polysiloxane compound is not particularly limited, and a method using a hydrosilylation reaction is preferable because a cationically polymerizable group can be introduced into a polysiloxane compound via a chemically stable silicon-carbon bond (Si—C bond). In other words, the component (A) is preferably a polysiloxane compound which is organically modified by a hydrosilylation reaction and into which a cationically polymerizable group is introduced via a silicon-carbon bond. Preferably, the alkali-soluble group is also introduced into the polysiloxane compound via a silicon-carbon bond by a hydrosilylation reaction.

The component (A) is obtained by, for example, a hydrosilylation reaction using the following compounds (α), (β), and (γ) as starting substances.

Compound (α): Polysiloxane compound having at least two SiH groups (hydrosilyl groups) in one molecule.

Compound (β): Compound having a carbon-carbon double bond having reactivity with SiH group and a cationically polymerizable group in one molecule.

Compound (γ): Compound having a carbon-carbon double bond having reactivity with a SiH group and an alkali-soluble group in one molecule.

(Compound (α))

The compound (α) is a polysiloxane compound having at least two SiH groups in one molecule, and it is possible to used, for example, a compound disclosed in WO 96/15194, which has at least two SiH groups in one molecule. Specific examples of the compound (α) include hydrosilyl group-containing polysiloxanes having a linear structure, polysiloxanes having a hydrosilyl group at a molecular terminal, and a cyclic polysiloxanes containing a hydrosilyl group (hereinafter, sometimes referred to simply as "cyclic polysiloxane"). The cyclic polysiloxane may have a polycyclic structure, and the polycyclic structure may be a polyhedral structure. For forming an adhesive layer having high heat resistance and mechanical strength, it is preferable that a cyclic polysiloxane compound having at least two SiH groups in one molecule is used as the compound (α). The compound (α) is preferably a cyclic polysiloxane having three or more SiH groups in one molecule. From the viewpoint of heat resistance and light resistance, the group present on the Si atom is preferably a hydrogen atom or a methyl group.

Examples of the hydrosilyl group-containing polysiloxane having a linear structure include a copolymers of a dimethylsiloxane unit with a methylhydrogensiloxane unit and a terminal trimethylsiloxy unit, copolymers of a diphenylsiloxane unit with a methylhydrogensiloxane unit and a terminal trimethylsiloxy unit, copolymers of a methylphenylsiloxane unit with a methylhydrogensiloxane unit, and a terminal trimethylsiloxy unit, and polysiloxanes terminally blocked with a dimethylhydrogensilyl group.

Examples of the polysiloxane having a hydrosilyl group at a molecular terminal include polysiloxanes terminally blocked with a dimethylhydrogensilyl group, and polysiloxanes including a dimethylhydrogensiloxane unit ($H(CH_3)_2SiO_{1/2}$ unit) and one or more siloxane units selected from the group consisting of a $SiO_2$ unit, a $SiO_{32}$ unit, and a SiO unit.

The cyclic polysiloxane is represented by, for example, the following general formula (I).

General Formula I (I)

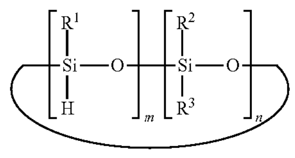

In the general formula I, $R^1$, $R^2$, and $R^3$ each independently represent a monovalent organic group having 1 or more and 20 or less carbon atoms, m represents an integer of 2 or more and 10 or less, and n represents an integer of 0 or more and 10 or less. For easily carrying out the hydrosilylation reaction, m is preferably 3 or more. For easily carrying out the hydrosilylation reaction, m+n is preferably 3 or more and 12 or less. For easily carrying out the hydrosilylation reaction, n is preferably 0.

$R^1$, $R^2$, and $R^3$ are each preferably an organic group having one or more elements selected from the group consisting of C, H, and O. Examples of $R^1$, $R^2$, and $R^3$ include alkyl groups, hydroxyalkyl groups, alkoxyalkyl groups, oxyalkyl groups, and aryl groups. Among them, chain alkyl groups such as a methyl group, an ethyl group, a propyl group, a hexyl group, an octyl group, a decyl group, and a dodecyl group; cyclic alkyl groups such as cyclohexyl groups and norbornyl groups; or a phenyl group is preferable. From the viewpoint of availability of the cyclic polysiloxane, $R^1$, $R^2$, and $R^3$ are each preferably a chain alkyl group having 1 or more and 6 or less carbon atoms, or a phenyl group. For easily carrying out the hydrosilylation reaction, $R^1$, $R^2$, and $R^3$ are each preferably a chain alkyl group, more preferably a chain alkyl group having 1 or more and 6 or less carbon atoms, still more preferably a methyl group.

Examples of the cyclic polysiloxane represented by the general formula I include 1,3,5,7-tetrahydrogen-1,3,5,7-tetramethylcyclotetrasiloxane, 1-propyl-3,5,7-trihydrogen-1,3,5,7-tetramethylcyclotetrasiloxane, 1,5-dihydrogen-3,7-dihexyl-1,3,5,7-tetramethylcyclotetrasiloxane, 1,3,5-trihydrogen-1,3,5-trimethylcyclotrisiloxane, 1,3,5,7,9-pentahydrogen-1,3,5,7,9-pentamethylcyclopentasiloxane, and 1,3,5,7,9,11-hexahydrogen-1,3,5,7,9,11-hexamethylcyclohexasiloxane. Among them, 1,3,5,7-tetrahydrogen-1,3,5,7-tetramethylcyclotetrasiloxane (a compound of the general formula I in which m is 4, n is 0, and $R^1$ is a methyl group) is preferable from the viewpoint of availability, and reactivity of the SiH group.

The compound (α) is obtained by a known synthesis method. The cyclic polysiloxane represented by the general formula I can be synthesized by, for example, a method disclosed in WO 96/15194 A or the like. The cyclic polysiloxane having a polyhedral backbone can be synthesized by, for example, a method described in Japanese Patent Laid-Open Publication No. 2004-359933, Japanese Patent Laid-Open Publication No. 2004-143449, Japanese Patent Application Laid-Open Publication No. 2006-269402 or the like. As the compound (α), a commercially available polysiloxane compound may be used.

For forming an adhesive layer further excellent in heat resistance while enhancing the developability of the specific photosensitive composition, the content of the structural unit derived from the compound (α) in the component (A) is preferably 10 wt % or more and 50 wt % or less, more preferably 15 wt % or more and 45 wt % or less, based on 100 wt % of the component (A).

(Compound (β))

The compound (β) has a carbon-carbon double bond having reactivity with a SiH group (hydrosilyl group) and a cationically polymerizable group in one molecule, and is used for introducing a cationically polymerizable group into a polysiloxane compound. The cationically polymerizable group in the compound (β), together with its preferred aspects, is the same as described above for the cationically polymerizable group of the component (A). That is, the compound (β) has preferably one or more selected from the group consisting of a glycidyl group, an alicyclic epoxy group and an oxetanyl group, more preferably one or more selected from the group consisting of a glycidyl group and an alicyclic epoxy group, still more preferably has an alicyclic epoxy group, as the cationically polymerizable group.

Examples of the group containing a carbon-carbon double bond having reactivity with a SiH group (hereinafter, sometimes referred to simply as an "alkenyl group") include a vinyl group, an allyl group, a methallyl group, an allyloxy group ($—O—CH_2—CH—CH_2$), a 2-allylphenyl group, a 3-allylphenyl group, a 4-allylphenyl group, a 2-(allyloxy) phenyl group, a 3-(allyloxy) phenyl group, a 4-(allyloxy) phenyl group, a 2-(allyloxy)ethyl group, a 2,2-bis(allyloxymethyl)butyl group, a 3-allyloxy-2,2-bis (allyloxymethyl)propyl group, and a vinyl ether group. From the viewpoint of reactivity with a SiH group, the compound (β) has preferably one or more selected from the group consisting of a vinyl group, an allyl group and an allyloxy group, more preferably one or more selected from the group consisting of a vinyl group and an allyl group, as the alkenyl group.

Specific examples of the compound (β) include 1-vinyl-3,4-epoxycyclohexane, allyl glycidyl ether, allyl oxetanyl ether, diallyl monoglycidyl isocyanurate, and monoallyl diglycidyl isocyanurate. From the viewpoint of reactivity in cationic polymerization, the compound (β) is preferably a compound having one or more functional groups selected from the group consisting of an alicyclic epoxy group and a glycidyl group, more preferably a compound having an alicyclic epoxy group. For further enhancing the reactivity in cationic polymerization, the compound (β) is preferably one or more compounds selected from the group consisting of diallyl monoglycidyl isocyanurate and 1-vinyl-3,4-epoxycyclohexane, more preferably 1-vinyl-3,4-epoxycyclohexane.

For forming an adhesive layer further excellent in heat resistance while enhancing the developability of the specific photosensitive composition, the content of the structural unit derived from the compound (β) in the component (A) is preferably 20 wt % or more and 50 wt % or less, more preferably 22 wt % or more and 45 wt % or less, based on 100 wt % of the component (A).

(Compound (γ))

The compound (γ) has a carbon-carbon double bond having reactivity with a SiH group and an alkali-soluble group in one molecule, and is used for introducing an alkali-soluble group into a polysiloxane compound. The alkali-soluble group in the compound (γ), together with its preferred aspects, is the same as described above for the alkali-soluble group of the component (A). That is, it is preferable that the compound (γ) preferably has one or more selected from the group consisting of an X1 group and an X2 group as the alkali-soluble group.

The compound (γ) has a group containing a carbon-carbon double bond having reactivity with a SiH group (alkenyl group). Examples of the alkenyl group of the compound (γ), together with its preferred aspects, include those exemplified above for the alkenyl group of the compound (β). That is, the compound (γ) has preferably one or more selected from the group consisting of a vinyl group, an allyl group and an allyloxy group, more preferably one or more selected from the group consisting of a vinyl group and an allyl group, as the alkenyl group.

The compound (γ) may have two or more alkenyl groups in one molecule. When the compound (γ) contains a plurality of alkenyl groups in one molecule, a plurality of compounds (a) can be crosslinked by the hydrosilylation reaction, and therefore the crosslinking density of the resulting cured product tends to increase, resulting in improvement of the heat resistance of the cured product.

Specific examples of the compound (γ) include diallyl isocyanurate, monoallyl isocyanurate, 2,2'-diallyl bisphenol A, vinylphenol, allylphenol, butenoic acid, pentenoic acid, hexenoic acid, heptenoic acid, and undecylenic acid.

For obtaining a specific photosensitive composition excellent in developability, the compound (γ) is preferably one or more selected from the group consisting of diallyl isocyanurate, monoallyl isocyanurate and 2,2'-diallyl bisphenol A, more preferably one or more selected from the group consisting of diallyl isocyanurate and monoallyl isocyanurate. When monoallyl isocyanurate is used as the compound (γ), a component (A) having the X1 group as an alkali-soluble group is obtained. When diallyl isocyanurate is used as the compound (γ), a component (A) having the X2 group as an alkali-soluble group is obtained.

For obtaining a specific photosensitive composition further excellent in developability, the content of the structural unit derived from the compound (γ) in the component (A) is preferably 5 wt % or more and 50 wt % or less, more preferably 10 wt % or more and 30 wt % or less, based on 100 wt % of the component (A).

Other Starting Substances

In addition to the compound (α), compound (β), and compound (γ), other starting substances may be used in the hydrosilylation reaction. For example, an alkenyl group-containing compound which is different from the compound (β) and compound (γ) (hereinafter, sometimes referred to as "another alkenyl group-containing compound") may be used as the other starting substance.

For introducing a radically polymerizable group into the component (A), it is preferable that a compound having an alkenyl group and a (meth)acryloyl group in one molecule (hereinafter, sometimes referred to as a "compound (δ)") is used as another alkenyl group-containing compound. When the compound (δ) is used, the component (A) can be photoradically polymerized because a (meth)acryloyl group is introduced into the component (A).

Specific examples of the compound (δ) include vinyl acrylate, vinyl methacrylate, allyl acrylate, allyl methacrylate, 2-butenyl acrylate, and 2-butenyl methacrylate.

For obtaining an adhesive layer further excellent in heat resistance, it is preferable to use a compound having two or more alkenyl groups in one molecule (hereinafter, sometimes referred to as a "compound (ε)") as another alkenyl group-containing compound. When the compound (ε) is used, the heat resistance of the obtained adhesive layer tends to be further improved because the number of crosslinking points increases during the hydrosilylation reaction.

Specific examples of the compound (ε) include diallyl phthalate, triallyl trimellitate, diethylene glycol bisallyl carbonate, 1,1,2,2-tetraallyloxyethane, triallyl cyanurate, triallyl isocyanurate, diallyl monobenzyl isocyanurate, diallyl monomethyl isocyanurate, 1,2,4-trivinylcyclohexane, triethylene glycol divinyl ether, divinylbenzene, divinylbiphenyl, 1,3-diisopropenylbenzene, 1,4-diisopropenylbenzene, 1,3-bis(allyloxy)adamantane, 1,3-bis(vinyloxy)adamantane, 1,3,5-tris(allyloxy)adamantane, 1,3,5-tris(vinyloxy)adamantane, dicyclopentadiene, vinylcyclohexene, 1,5-hexadiene, 1,9-decadiene, diallyl ether, and oligomers thereof.

For further improving the heat resistance of the resulting adhesive layer, the compound (ε) is preferably one or more selected from the group consisting of triallyl isocyanurate and diallyl monomethyl isocyanurate, more preferably diallyl monomethyl isocyanurate.

For enhancing alkali developability while further improving the heat resistance of the resulting adhesive layer, the content of the structural unit derived from the compound (ε) in the component (A) is preferably 5 wt % or more and 30 wt % or less, more preferably 8 wt % or more and 20 wt % or less, based on 100 wt % of the component (A).

(Hydrosilylation Reaction)

The order and the method of the hydrosilylation reaction for obtaining the component (A) are not particularly limited. For example, the component (A) is obtained by a hydrosilylation reaction conforming to a method disclosed in WO 2009/075233 and using the compound (α), the compound (β), the compound (γ), and other starting substances as optional components if necessary. The component (A) obtained using the compound (α), the compound (β), the compound (γ), and other starting substances as optional components if necessary is, for example, a polymer having a plurality of cationically polymerizable groups and a plurality of alkali-soluble groups in one molecule, and a polysiloxane structure in the main chain.

The proportion of each compound in the hydrosilylation reaction is not particularly limited, but the total amount A of alkenyl groups and the total amount B of SiH groups in the starting substance preferably satisfy $1<B/A\leq30$, and more preferably satisfy $1\leq B/A\leq10$.

In the hydrosilylation reaction, a hydrosilylation catalyst such as chloroplatinic acid, a platinum-olefin complex, or a platinum-vinylsiloxane complex may be used. The hydrosilylation catalyst and a co-catalyst may be used in combination. The addition amount (substance amount) of the hydrosilylation catalyst is not particularly limited, and is preferably 10-8 or more and 10-1 or less times, more preferably 106 or more and 10-2 or less times the total substance amount of alkenyl groups contained in the starting substance.

The temperature of the hydrosilylation reaction may be appropriately set, and is preferably 30° C. or higher and 200° ° C. or lower, more preferably 50° C. or higher and 150° C. or lower. The oxygen concentration of the gas phase portion in the hydrosilylation reaction is preferably 3 vol % or less. From the viewpoint of accelerating the hydrosilylation reaction, the gas phase portion may contain oxygen in an amount of 0.1 vol % or more and 3 vol % or less.

A solvent may be used in the hydrosilylation reaction. As the solvent, a single solvent or a mixture of two or more solvents can be used. Examples of the solvent that can be used include hydrocarbon-based solvents such as benzene, toluene, xylene, hexane, and heptane; ether-based solvents such as tetrahydrofuran, 1,4-dioxane, 1,3-dioxolane, and diethyl ether; ketone-based solvents such as acetone and methyl ethyl ketone; halogen-based solvents such as chloroform, methylene chloride, and 1,2-dichloroethane. Toluene, xylene, tetrahydrofuran, 1,4-dioxane, 1,3-dioxolane, or chloroform is preferable because it is easily distilled off after the reaction. In the hydrosilylation reaction, a gelling inhibitor may be used if necessary.

For forming an adhesive layer excellent in heat resistance while enabling further suppression of generation of optical noise by reducing the refractive index of the adhesive layer, the content of the component (A) in the specific photosensitive composition is preferably 20 wt % or more and 95 wt % or less based on the total solid content of the specific photosensitive composition.

{Component (B)}

The component (B) is preferably one or more selected from the group consisting of a photocationic polymerization initiator and a photoradical polymerization initiator. Since the specific photosensitive composition contains the component (A) having a cationically polymerizable group, the component (A) can be crosslinked by photocationic polymerization when the specific photosensitive composition contains a photocationic polymerization initiator as the component (B). In the case where the component (A) having a (meth)acryloyl group is used or when a component (C) described later is used, the component (A) or the component (C) can be crosslinked by photoradical polymerization when the specific photosensitive composition contains a photoradical polymerization initiator as the component (B). The specific photosensitive composition may contain both a photocationic polymerization initiator and a photoradical polymerization initiator as the component (B).

Photocationic Polymerization Initiator

As the photocationic polymerization initiator, for example, a known photocationic polymerization initiator can be used. The photocationic polymerization initiator is not particularly limited, and examples thereof include various compounds which are considered suitable in Japanese Patent Laid-open Publication No. 2000-1648, National Publication of International Patent Application No. 2001-515533, and WO 2002/83764. The photocationic polymerization initiator is preferably a sulfonate ester-based compound, a carboxylic acid ester-based compound, or an onium salt-based compound, more preferably an onium salt-based compound, still more preferably a sulfonium salt-based compound.

As the sulfonate ester-based compound, various sulfonic acid derivatives can be used, and examples thereof include disulfone-based compounds, disulfonyldiazomethane-based compounds, disulfonylmethane-based compounds, sulfonylbenzoylmethane-based compounds, imidosulfonate-based compounds, benzoin sulfonate-based compounds, pyrogallol trisulfonate-based compounds, and benzyl sulfonate-based compounds.

Specific examples of the sulfonate ester-based compound include diphenyl disulfone, ditosyl disulfone, bis(phenylsulfonyl)diazomethane, bis(chlorophenylsulfonyl)diazomethane, bis(xylylsulfonyl)diazomethane, phenylsulfonylbenzoyldiazomethane, bis(cyclohexylsulfonyl)methane, 1,8-naphthalenedicarboxylic acid imidomethylsulfonate, 1,8-naphthalenedicarboxylic acid imidotosylsulfonate, 1,8-naphthalenedicarboxylic acid imidotrifluoromethylsulfonate, 1,8-naphthalenedicarboxylic acid imidocamphorsulfonate, succinic acid imidophenylsulfonate, succinic acid imidotosylsulfonate, succinic acid imidotrifluoromethylsulfonate, succinic acid imidocamphorsulfonate, phthalic acid imidotrifluorosulfonate, cis-5-norbornene-endo-2,3-dicarboxylic acid imidotrifluoromethylsulfonate, benzoin tosylate, 1,2-diphenyl-2-hydroxypropyl tosylate, 1,2-di(4-methylmercaptophenyl)-2-hydroxypropyl tosylate, pyrogallol methylsulfonate, pyrogallol ethylsulfonate, 2,6-dinitrophenylmethyl tosylate, o-nitrophenylmethyl tosylate, and p-nitrophenyl tosylate.

These compounds can be used alone, or in combination of two or more thereof. In the present invention, a carboxylic acid ester-based compound can also be used as the photocationic polymerization initiator.

Examples of the onium salt-based compound include sulfonium salt-based compounds and iodonium salt-based compounds. Examples of the anion of the sulfonium salt-based compound and the iodonium salt-based compound include tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), tetraphenylborate, tetrakis(trifluoromethylphenyl)borate, tetrakis(pentafluoromethylphenyl)borate, fluoroalkylfluorophosphate, perchlorate ions ($ClO_4^-$), trifluoromethanesulfonate ions ($CF_3SO_3^-$), fluorosulfonate ions ($FSO_3^-$), and toluenesulfonate ions.

The photocationic polymerization initiators listed in descending order in terms of acid strength of the acid generated are as follows: compounds containing $SbF_6^-$ as an anion, compounds containing $B(C_6F_5)_4^-$ as an anion, compounds containing $PF_6^-$ as an anion, compounds containing $CF_3SO_3$ as an anion, and compounds containing $HSO_4^-$ as an anion. When a photocationic polymerization initiator which generates an acid having high acid strength is used, the residual film ratio tends to increase. The pKa of the acid generated from the photocationic polymerization initiator is preferably less than 3, more preferably less than 1.

The content of the photocationic polymerization initiator in the specific photosensitive composition is not particularly limited. From the viewpoint of the balance between the curing rate and the physical properties of the cured product, the content of photocationic polymerization initiator is preferably 0.1 parts by weight or more and 20 parts by weight or less, more preferably 0.5 parts by weight or more and 10 parts by weight or less, based on 100 parts by weight of the specific photosensitive composition.

If necessary, a thermal cationic polymerization initiator (a compound that generates a cation due to heat) may be blended in the specific photosensitive composition. Examples of the thermal cationic polymerization initiator include sulfonium salt-based compounds, iodonium salt-based compounds, benzothiazonium salt-based compounds, ammonium salt-based compounds, and phosphonium salt-based compounds. Among them, sulfonium salt-based compounds and benzothiazonium salt-based compounds are preferably used.

(Photoradical Polymerization Initiator)

Examples of the photoradical polymerization initiator include acetophenone-based compounds, acylphosphine oxide-based compounds, benzoin-based compounds, benzophenone-based compounds, α-diketone-based compounds, biimidazole-based compounds, polynuclear quinone-based compounds, triazine-based compounds, oxime ester-based compounds, titanocene-based compounds, xanthone-based compounds, thioxanthone-based compounds, ketal-based compounds, azo-based compounds, peroxides, 2,3-dialkyldione-based compounds, disulfide-based compounds, and fluoroamine-based compounds. From the viewpoint of patterning property, the photoradical polymerization initiator is preferably one or more selected from the group consisting of an acetophenone-based compound, a benzophenone-based compound, and an oxime ester-based compound, more preferably an acetophenone-based compound.

Examples of the acetophenone-based compound include 1-(4-dodecylphenyl)-2-hydroxy-2-methylpropane-1-one, 2,2-dimethoxy-2-phenylacetophenone, 2-hydroxy-2-methyl-1-phenylpropane-1-one, 1-(4'-i-propylphenyl)-2-hydroxy-2-methylpropane-1-one, 4-(2'-hydroxyethoxy)phenyl (2-hydroxy-2-propyl)ketone, 2,2-dimethoxyacetophenone, 2,2-diethoxyacetophenone, 2-methyl-1-(4'-methylthiophenyl)-2-morpholinopropane-1-one, 2-benzyl-2-dimethylamino-1-(4'-morpholinophenyl)butane-1-one, and 1-hydroxycyclohexylphenyl ketone.

Examples of the acylphosphine oxide-based compound include 2,4,6-trimethylbenzoyl-diphenylphosphine oxide and bis(2,4,6-trimethylbenzoyl)-phenylphosphine oxide.

Examples of the oxime ester-based compound include 1,2-octanedione 1-[4-(phenylthio)-2-(O-benzoyloxime)], and ethanone 1-[9-ethyl-6-(2-methylbenzoyl)-9H-carbazole-3-yl]-1-(O-acetyloxime).

Examples of the benzoin-based compound include benzoin, benzoin methyl ether, benzoin ethyl ether, benzoin isopropyl ether, and benzoin isobutyl ether.

Examples of the benzophenone-based compound include benzyl dimethyl ketone, benzophenone, 4,4'-bis(dimethylamino)benzophenone, and 4,4'-bis(diethylamino)benzophenone.

Examples of the α-diketone-based compound include methylbenzoylformate.

Examples of the biimidazole-based compound include 2,2'-bis(2-chlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4 -ethoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4,6-tribromophenyl)-4,4',5,5'-tetrakis(4-ethoxycarbonylphenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole, and 2,2'-bis(2,4,6-tribromophenyl)-4,4',5,5'-tetraphenyl-1,2'-biimidazole.

Examples of the polynuclear quinone-based compound include anthraquinone, 2-ethylanthraquinone, 2-t-butylanthraquinone, and 1,4-naphthoquinone.

Examples of the xanthone-based compound include xanthone, thioxanthone, and 2-chlorothioxanthone.

Examples of the triazine-based compound include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine, 2-(2'-furylethylidene)-4,6-bis(trichloromethyl)-s-triazine, 2-(4'-methoxystyryl)-4,6-bis-(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, and 2-(2'-thiophenylethylidene)-4,6-bis(trichloromethyl)-s-triazine.

The content of the photoradical polymerization initiator in the specific photosensitive composition is not particularly limited. From the viewpoint of the balance between the curing rate and the physical properties of the cured product, the content of photoradical polymerization initiator is preferably 0.1 parts by weight or more and 20 parts by weight or less, more preferably 0.5 parts by weight or more and 10 parts by weight or less, based on 100 parts by weight of the specific photosensitive composition.

If necessary, a thermal radical polymerization initiator (a compound that generates a radical due to heat) may be blended in the specific photosensitive composition. Specific examples of the thermal radical polymerization initiator include acetyl peroxide, benzoyl peroxide, methyl ethyl ketone peroxide, cyclohexanone peroxide, hydrogen peroxide, t-butyl hydroperoxide, cumene hydroperoxide, di-t-butyl peroxide, dicumyl peroxide, dilauroyl peroxide, t-butyl peroxyacetate, t-butyl peroxypivalate, azobisisobutyronitrile, azobisisovaleronitrile, ammonium persulfate, sodium persulfate, and potassium persulfate. One of these photoradical polymerization initiators may be used alone, or two or more thereof may be used in combination.

{Solvent}

The specific photosensitive composition may contain a solvent. For example, the component (A), the component (B), and other components used if necessary as described later are dissolved or dispersed in a solvent to obtain a specific photosensitive composition.

Specific examples of the solvent include hydrocarbon-based solvents such as benzene, toluene, hexane and heptane; ether-based solvents such as tetrahydrofuran, 1,4-dioxane, 1,3-dioxolane, and diethyl ether; ketone-based solvents such as acetone, methyl ethyl ketone, methyl isobutyl ketone, and cyclohexanone; glycol-based solvents such as propylene glycol 1-monomethyl ether 2-acetate, diethylene glycol dimethyl ether, diethylene glycol ethyl methyl ether, and ethylene glycol diethyl ether; ester-based solvents such as isobutyl isobutyrate; and halogen-based solvents such as chloroform, methylene chloride, and 1,2-dichloroethane. From the viewpoint of the applicability (film formation stability) of the specific photosensitive composition, the solvent is preferably an ester-based solvent, more preferably isobutyl isobutyrate.

From the viewpoint of applicability (film formation stability) of the specific photosensitive composition, the amount of the solvent is preferably 0.5 parts by weight or more and 100 parts by weight or less, more preferably 1 part by weight or more and 50 parts by weight or less, based on 100 parts by weight of the component (A).

{Other Components}

The specific photosensitive composition may contain components other than the above-described component (A) and component (B) (other components) as a solid content (components other than the solvent) as long as the purpose and the effects of the present invention are not impaired. However, for forming an adhesive layer excellent in heat resistance while enabling further suppression of generation of optical noise by reducing the refractive index of the adhesive layer, the total content of the component (A) and the component (B) is preferably 50 wt % or more, more preferably 60 wt % or more, still more preferably 70 wt % or more and 100 wt % or less, based on the total solid content of the specific photosensitive composition.

Examples of the other component include a compound having a radically polymerizable group, a reactive diluent, a sensitizer, a polymer dispersant, a thermoplastic resin, a filler, a basic compound, an adhesiveness improver, a coupling agent (silane coupling agent or the like), an antioxidant, a radical inhibitor, a mold release agent, a flame retardant, a flame retardant promoter, a surfactant, an antifoaming agent, an emulsifier, a leveling agent, a cissing inhibitor, an ion trapping agent (antimony-bismuth or the like), a thixotropy imparting agent, a tackifier, a storage stability improver, an ozone degradation inhibitor, a light stabilizer, a thickener, a plasticizer, a heat stabilizer, a conductivity imparting agent, an antistatic agent, a radiation blocking agent, a nucleating agent, a phosphorus-based peroxide decomposer, a lubricant, a metal deactivator, a thermal conductivity imparting agent, and a physical property modifier.

(Compound Having Radically Polymerizable Group)

The specific photosensitive composition may contain a compound having a radically polymerizable group (hereinafter, sometimes referred to as a "component (C)") as the other component. Since the component (C) is the other component (a component other than the component (A) and the component (B)), the component (C) has a radically polymerizable group and does not have a siloxane unit. The specific photosensitive composition containing the component (C) tends to be excellent in deep-curing (property of being photocrosslinkable even at a deep part) in patterning. When the adhesive layer is formed by photolithography using the specific photosensitive composition containing the component (C), the taper angle can be easily adjusted to more than 90°. When the adhesive layer is formed by photolithography using the specific photosensitive composition containing the component (A) having a radically polymerizable group, the taper angle can be adjusted to more than 90°. However, for easily adjusting the taper angle to 95° or more in formation of the adhesive layer by photolithography using the photosensitive composition, it is preferable that the photosensitive composition used contains the component (A), the component (B), and the component (C), with the component (B) being a photoradical polymerization initiator.

Examples of the component (C) include compounds having a radically polymerizable unsaturated bond (ethylenically unsaturated bond or the like). Examples of the ethylenically unsaturated bond include a (meth)acryloyl group and a vinyl group.

Specific examples of the component (C) include allyl (meth)acrylate, vinyl (meth)acrylate, dicyclopentenyl (meth)acrylate, dicyclopentenyloxyethyl (meth)acrylate, (meth)acrylate-modified allyl glycidyl ether ("Denacol (registered trademark) Acrylate DA111" manufactured by Nagase ChemteX Corporation), urethane (meth)acrylate-based compounds, epoxy (meth)acrylate-based compounds, trimethylolpropane tri(meth)acrylate, pentaerythritol tetra (meth)acrylate, ditrimethylolpropane tetra(meth)acrylate, dipentaerythritol hexa(meth)acrylate, butanediol di(meth) acrylate, nonanediol di(meth)acrylate, polypropylene glycol (meth)acrylate, bisphenol A di(meth)acrylate, and tris(2-(meth)acryloyloxyethyl)isocyanurate.

Since the component (C) has high curability, the component (C) is also suitable as a material for a photosensitive composition when a method other than photolithography (for example, a screen printing method, 3D printing or the like) is used for patterning.

For obtaining an optical semiconductor device which further suppresses generation of optical noise and is excellent in reliability, the content of the component (C) in the specific photosensitive composition is preferably 1% by weight or more and 50% by weight or less, more preferably 5% by weight or more and 40% by weight or less, still more preferably 10% by weight or more and 30% by weight or less, based on the total solid content of the specific photosensitive composition.

(Reactive Diluent)

The specific photosensitive composition may contain a reactive diluent. The reactive diluent is a component which engages in a curing reaction while reducing the viscosity of a specific photosensitive composition. When the specific photosensitive composition contains a reactive diluent, it is possible to reduce shrinkage of the resulting adhesive layer on curing and control the mechanical strength of the adhesive layer.

As the reactive diluent, for example, a compound having two or more cationically polymerizable groups in one molecule is used. Examples of the cationically polymerizable group of the reactive diluent include those exemplified above as the cationically polymerizable group of the component (A). The type of the cationically polymerizable group of the reactive diluent may be identical to or different from the type of the cationically polymerizable group of the component (A). From the viewpoint of enhancing cationic polymerization reactivity, it is preferable that the reactive diluent has an alicyclic epoxy group as a cationically polymerizable group. In a particularly preferred embodiment, the component (A) contains an alicyclic epoxy group as a cationically polymerizable group, and the reactive diluent has two or more alicyclic epoxy groups in one molecule.

Examples of the compound having two or more alicyclic epoxy groups in one molecule include 3',4'-epoxycyclohexylmethyl-3,4-epoxycyclohexane carboxylate ("CELLOXIDE (registered trademark) 2021P" manufactured by DAICEL CORPORATION), &-caprolactone-modified-3',4'-epoxycyclohexylmethyl-3,4-epoxycyclohexane carboxylate ("CELLOXIDE (registered trademark) 2081" manufactured by DAICEL CORPORATION), bis(3,4-epoxycyclohexylmethyl) adipate, an epoxy-modified chain siloxane compound represented by the following chemical formula S1 ("X-40-2669" manufactured by Shin-Etsu Chemical Co., Ltd.), and an epoxy-modified cyclic siloxane compound represented by the following chemical formula S2 ("KR-470" manufactured by Shin-Etsu Chemical Co., Ltd.).

Chemical Formula S1 and S2

(S1)

(S2)

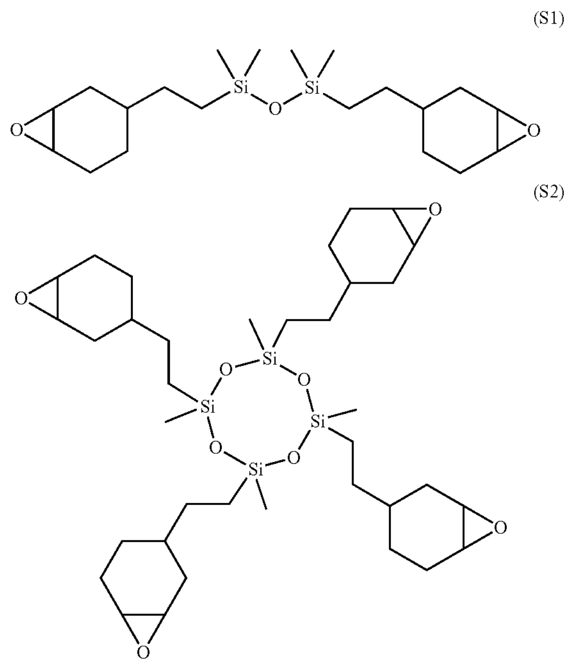

From the viewpoint of improving the curing rate of the specific photosensitive composition and balancing the physical properties of the cured product, the content of the reactive diluent is preferably 2 wt % or more and 50 wt % or less, more preferably 3 wt % or more and 40 wt % or less, based on the total solid content of the specific photosensitive composition.

(Sensitizer)

The specific photosensitive composition may contain a sensitizer. By using a sensitizer, the exposure sensitivity during patterning is improved. The sensitizer is preferably an anthracene-based compound. Specific examples of the anthracene-based compound include anthracene, 2-ethyl-9, 10 dimethoxyanthracene, 9,10-dimethylanthracene, 9,10-dibutoxyanthracene, 9,10-dipropoxyanthracene, 9,10-diethoxyanthracene, 1,4-dimethoxyanthracene, 9-methylanthracene, 2-ethylanthracene, 2-t-butylanthracene, 2,6-di-t-butylanthracene, and 9, 10 diphenyl-2,6-di-t- butylanthracene. Among them, 9,10-dibutoxyanthracene, 9,10-dipropoxyanthracene, and 9,10-diethoxyanthracene are preferable from the viewpoint of compatibility with the specific photosensitive composition.

The content of the sensitizer in the specific photosensitive composition is not particularly limited, and is preferably 0.01 parts by weight or more and 20 parts by weight or less, more preferably 0.1 parts by weight or more and 15 parts by weight or less, based on 100 parts by weight of the component (A), from the viewpoint of curability and the balance of the physical properties of the cured product.

(Polymer Dispersant)

The specific photosensitive composition may contain a polymer dispersant. The polymer dispersant is preferably a compound having an acidic functional group. Examples of the acidic functional group include a carboxy group, a sulfo group, and a phosphate group, and a carboxy group is preferable. The acid value of the polymer dispersant is preferably 10 mg KOH/g or more and 100 mg KOH/g or less. Examples of the polymer dispersant include compounds such as urethane-based compounds, polyimide-based compounds, alkyd-based compounds, epoxy-based compounds, polyester-based compounds, melamine-based compounds, phenol-based compounds, acryl-based compounds, vinyl chloride-based compounds, vinyl chloride-vinyl acetate copolymer-based compounds, polyamide-based compounds, and polycarbonate-based compounds. Among them, one or more selected from the group consisting of acryl-based compounds and polyester-based compounds are preferable.

(Thermoplastic Resin)

The specific photosensitive composition may contain a thermoplastic resin. Examples of the thermoplastic resin include acryl-based resins, polycarbonate-based resins, cycloolefin-based resins, olefin-maleimide-based resins, polyester-based resins, polyethersulfone resins, polyarylate resins, polyvinyl acetal resins, polyethylene resins, polypropylene resins, polystyrene resins, polyamide resins, silicone resins, fluororesins, and rubber-like resins. The thermoplastic resin may have a crosslinkable group such as an epoxy group, an amino group, a radically polymerizable unsaturated group, a carboxy group, an isocyanate group, a hydroxy group, or an alkoxysilyl group.

(Filler)

The specific photosensitive composition may contain a filler. In particular, when the adhesive layer is formed by screen printing or 3D printing, it is preferable that a filler is added to develop thixotropy. The filler is not particularly limited, and examples of the filler that can be used include inorganic fillers such as silica-based fillers (quartz, fumed silica, precipitated silica, anhydrous silicic acid, fused silica, crystalline silica, ultrafine amorphous silica, and the like), silicon nitride, silver powder, alumina, aluminum hydroxide, titanium oxide, glass fiber, carbon fiber, mica, carbon black, graphite, diatomaceous earth, white clay, clay, talc, calcium carbonate, magnesium carbonate, barium sulfate, and inorganic balloons, and organic fillers such as epoxy-based fillers. Among them, fumed silica is preferable because thixotropy can be developed by adding a small amount of fumed silica. For example, various grades of fumed silica manufactured by Nippon Aerosil Co., Ltd. can be used.

(Basic Compound)

The specific photosensitive composition may contain a basic compound. The basic compound acts as a quencher. That is, by blending an appropriate amount of the basic compound in the specific photosensitive composition, involvement of a non-exposed portion in the photocuring reaction can be prevented. This clarifies the contrast between the exposed portion and the non-exposed portion, resulting in improvement of the resolution.

The blending amount of the basic compound is preferably 0.001 parts by weight or more and 2.0 parts by weight or less, more preferably 0.01 parts by weight or more and 1.0 parts by weight or less, based on 100 parts by weight of the component (A). When the blending amount of the basic compound is 0.001 parts by weight or more, the function as a quencher can be sufficiently exhibited. When the blending amount of the basic compound is 2.0 parts by weight or less, the sensitivity can be improved.

The weight ratio of the basic compound to the photocationic polymerization initiator (basic compound/photocationic polymerization initiator) is, for example, 0.001 or more and 0.2 or less, preferably 0.01 or more and 0.15 or less. When the weight ratio is 0.001 or more, the function as a quencher can be sufficiently exhibited. When the weight ratio is 0.2 or less, crosslinking can be performed adequately.

The basic compound is not particularly limited, and examples thereof include primary, secondary, and tertiary aliphatic amine-based compounds, mixed amine-based compounds, aromatic amine-based compounds, heterocyclic amine-based compounds, amide derivatives, and imide derivatives. Among them, aromatic amine-based compounds and heterocyclic amine-based compounds can be suitably used as the basic compound.

Examples of the aromatic amine-based compound and the heterocyclic amine-based compound include aniline, pyrrole, oxazole, thiazole, imidazole, pyrazole, furazan, pyrroline, pyrrolidine, imidazoline, imidazolidine, pyridine, pyridazine, pyrimidine, pyrazine, pyrazoline, pyrazolidine, piperidine, piperazine, morpholine, indole, isoindole, 1H-indazole, indoline, quinoline, cinnoline, quinazoline, quinoxaline, phthalazine, purine, pteridine, carbazole, phenanthridine, acridine, phenazine, 1,10-phenanthroline, adenine, adenosine, guanine, guanosine, uracil, uridine, and derivatives thereof (for example, bis(2-morpholinoethyl)ether). Examples of the heterocyclic amine-based compound also include 2,6-lutidine.

One of the basic compounds may be used alone, or two or more thereof may be used in combination.

Among the basic compounds, hindered amines having a structure represented by the following general formula II are also used as an antioxidant, and therefore the heat resistance and the light resistance of the adhesive layer can be improved by adding the hindered amine.

General Formula II (II)

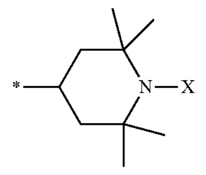

In general formula II, X represents a hydrogen atom; an alkyl group having 1 or more and 20 or less carbon atoms; a cycloalkyl group having 3 or more and 20 or less carbon atoms; or an acyl group having 2 or more and 20 or less carbon atoms. "*" in general formula II represents a binding site for another structure. From the viewpoint of solubility and performance as a quencher and an antioxidant, X is preferably an alkyl group having 1 or more and 20 or less carbon atoms, more preferably a methyl group.

Specific examples of the compound in which X is an alkyl group having 1 or more and 20 or less carbon atoms, a cycloalkyl group having 3 or more and 20 or less carbon atoms, or an acyl group having 2 or more and 20 or less carbon atoms include mixtures of bis(1,2,2,6,6-pentamethyl-4-piperidyl) sebacate and methyl 1,2,2,6,6-pentamethyl-4-piperidyl sebacate, bis(1,2,2,6,6-pentamethyl-4-piperidyl) sebacate, 1,2,2,6,6-pentamethyl-4-piperidyl methacrylate, bis(1,2,2,6,6-pentamethyl-4-piperidyl) 2-n-butyl-2-(3,5-di-t-butyl-4-hydroxybenzyl) malonate, bis(1,2,2,6,6-pentamethyl-4-piperidyl) 4-methoxybenzylidenemalonate, tetrakis (1,2,2,6,6-pentamethyl-4-piperidyl) 1,2,3,4-butanetetracarboxylate, and mixed esterified products of 1,2,3,4-butanetetracarboxylic acid with 1,2,2,6,6-pentamethyl-4-piperidinol, and 3,9-bis(2-hydroxy-1,1-dimethylethyl)-2,4,8,10-tetraoxaspiro[5,5]undecane.

Specific examples of the compound in which X is a hydrogen atom include bis(2,2,6,6-tetramethyl-4-piperidyl) sebacate, 2,2,6,6-tetramethyl-4-piperidyl benzoate, 2,2,6,6-tetramethyl-4-piperidyl methacrylate, mixed esterified products of 1,2,3,4-butanetetracarboxylic acid with 2,2,6,6-tetramethyl-4-piperidinol and 1-tridecanol, ester compounds of dimethyl succinate and 1-(2-hydroxyethyl)-4-hydroxy-2,2,6,6-tetramethylpiperidine, and polymerization products of N,N'-bis(2,2,6,6-tetramethyl-4-piperidyl)hexamethylenediamine and 1,2-dibromoethane.

(Adhesiveness Improver)

The specific photosensitive composition may contain an adhesiveness improver. Examples of the adhesiveness improver include various coupling agents, epoxy compounds, oxetane compounds, phenol resins, coumarone-indene resins, rosin ester resins, terpene-phenol resins, α-methylstyrene-vinyltoluene copolymers, polyethylmethylstyrene, and aromatic polyisocyanates.

Examples of the coupling agent include silane coupling agents. The silane coupling agent is not particularly limited as long as it is a compound having at least one reactive functional group and at least one hydrolyzable silicon-containing group in the molecule. The reactive functional group is preferably one or more functional groups selected from the group consisting of an epoxy group, a (meth)acrylic group, an isocyanate group, an isocyanurate group, a vinyl group, and a carbamate group from the viewpoint of handleability, and particularly preferably an epoxy group, a methacrylic group or an acrylic group from the viewpoint of curability and adhesiveness. The hydrolyzable silicon-containing group is preferably an alkoxysilyl group from the viewpoint of handleability, and particularly preferably a methoxysilyl group or an ethoxysilyl group from the viewpoint of reactivity.

Examples of the preferred silane coupling agent include alkoxysilane-based compounds having an epoxy group, such as 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; alkoxysilane-based compounds having a (meth)acrylic group, such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane; tris[3-(trimethoxysilylpropyl)]isocyanurate; and γ-isocyanate propyltrimethoxysilane. One of these silane coupling agents may be used alone, or two or more thereof may be used in combination.

The addition amount of the silane coupling agent can be appropriately set, and is preferably 0.1 parts by weight or more and 20 parts by weight or less, more preferably 0.3 parts by weight or more and 10 parts by weight or less, still more preferably 0.5 parts by weight or more and 5 parts by weight or less, based on 100 parts by weight of the compound having a cationically polymerizable group.

(Antioxidant)

The specific photosensitive composition may contain an antioxidant. Examples of the antioxidant include common antioxidants such hindered phenol-based antioxidants, and citric acid, phosphoric acid, and sulfur-based antioxidants. As the hindered phenol antioxidant, various antioxidants can be used, such as IRGANOX (registered trademark) 1010 available from BASF SE. Examples of the sulfur-based antioxidant include mercaptan-based compounds, salts of mercaptan-based compounds, sulfide-based compounds (sulfide carboxylic acid ester-based compounds and the like), polysulfide-based compounds, dithiocarboxylic acid salt-based compounds, thiourea-based compounds, thiophosphate-based compounds, sulfonium-based compounds, thioaldehyde-based compounds, thioketone-based compounds, mercaptal-based compounds, mercaptol-based compounds, monothioacid-based compounds, polythioacid-based compounds, thioamide-based compounds, and sulfoxide-based compounds. One of these antioxidants may be used alone, or two or more thereof may be used in combination.

(Radical Inhibitor)

The specific photosensitive composition may contain a radical inhibitor. Examples of the radical inhibitor include phenolic radical inhibitors such as 2,6-di-t-butyl-3-methylphenol (BHT), 2,2'-methylene-bis(4-methyl-6-t-butylphenol), and tetrakis(methylene-3(3,5-di-t-butyl-4-hydroxyphenyl)propionate)methane; and amine-based radical inhibitors such as phenyl-β-naphthylamine, α-naphthylamine, N,N'-secondary butyl-p-phenylenediamine, phenothiazine, and N,N'-diphenyl-p-phenylenediamine. One of these radical inhibitors may be used alone, or two or more thereof may be used in combination.

As a material of the adhesive layer, not only the specific photosensitive composition, but also a photosensitive composition containing a cationically polymerizable compound other than the component (A) can be used. Examples of the cationically polymerizable compound other than the component (A) include bisphenol A type epoxy resins, hydrogenated bisphenol A type epoxy resins, novolac phenol type epoxy resins, biphenyl type epoxy resins, dicyclopentadiene type epoxy resins, bisphenol F diglycidyl ether, bisphenol A diglycidyl ether, 2,2'-bis(4-glycidyloxycyclohexyl)propane, vinylcyclohexene dioxide, 2-(3,4-epoxycyclohexyl)-5,5-spiro-(3,4-epoxycyclohexane)-1,3-dioxane, bis(3,4-epoxycyclohexyl)adipate, 1,2-cyclopropanedicarboxylic acid bisglycidyl esters, triglycidyl isocyanurate, monoallyl diglycidyl isocyanurate, diallyl monoglycidyl isocyanurate, 3-ethyl-3-(phenoxymethyl)oxetane, 3',4'-epoxycyclohexylmethyl 3,4-epoxycyclohexanecarboxylate ("CELLOXIDE (registered trademark) 2021 P" manufactured by DAICEL CORPORATION), ε-caprolactone-modified 3',4'-epoxycyclohexylmethyl 3,4-epoxycyclohexanecarboxylate ("CELLOXIDE (registered trademark) 2081" manufactured by DAICEL CORPORATION), an epoxy-modified chain siloxane compound represented by the chemical formula S1 ("X-40-2669" manufactured by Shin-Etsu Chemical Co., Ltd.), and an epoxy-modified cyclic siloxane compound represented by the chemical formula S2 ("KR-470" manufactured by Shin-Etsu Chemical Co., Ltd.).

When the adhesive layer is formed by dispensing, screen printing, 3D printing, or the like, a photosensitive composition containing a polysiloxane compound having no alkali-soluble group can also be used as a material for the adhesive layer. Examples of the polysiloxane compound having no alkali-soluble group include compounds identical in structure to the component (A) except that an alkali-soluble group is not present.

It is also possible to use a thermosetting resin as a material for the adhesive layer. In particular, when the adhesive layer is formed by dispensing, screen printing, 3D printing, or the like, the material for the adhesive layer is preferably a thermosetting resin.

The thermosetting resin that can be used as a material for the adhesive layer is not particularly limited as long as it is a resin which is subjected to a curing reaction by any heating method. Specific examples of the thermosetting resin include silicone resins, epoxy resins, alkyd resins, polyimide resins, acrylic resins, polyamide resins, polyaramid resins, and phenol resins, and one of these resins may be used alone, or two or more thereof may be used in combination. Among them, silicone resins, epoxy resins, and polyimide resins are preferable from the viewpoint of the heat resistance and the light resistance of a cured product obtained by thermally curing a thermosetting resin, and silicone resins are more preferable because they have particularly high light resistance.

For reducing shrinkage on curing, the thermosetting resin is preferably an addition-type silicone resin containing, as essential components, an organic compound having two or more alkenyl groups, a hydrosilylation catalyst, and a compound having two or more SiH groups in one molecule.

The above-described photosensitive composition can be mixed with the thermosetting resin. The above-described components such as an adhesiveness improver, a filler and an antioxidant can be mixed as necessary. When the adhesive layer is formed from a thermosetting resin by screen printing or 3D printing, it is preferable that a filler is added to the thermosetting resin to develop thixotropy. As the filler, those described above can be used, and among them, fumed silica is preferable. For example, various grades of fumed silica manufactured by Nippon Aerosil Co., Ltd. can be used.

Preferred Aspect of Optical Semiconductor Device

For obtaining an optical semiconductor device which further suppresses generation of optical noise, is excellent in reliability, and can suppress reflection of foreign matter, the optical semiconductor device according to the first embodiment preferably satisfies the following condition 1, more preferably satisfies the following condition 2, still more preferably satisfies the following condition 3, and even more preferably satisfies the following condition 4.

Condition 1: The height of the adhesive layer is 15 μm or more and 300 μm or less, and the taper angle is 90° or more and 130° or less.

Condition 2: The height of the adhesive layer is 15 μm or more and 300 μm or less, and the taper angle is 95° or more and 125° or less.

Condition 3: The height of the adhesive layer is 30 μm or more and 150 μm or less, and the taper angle is 95° or more and 125° or less.

Condition 4: The height of the adhesive layer is 30 μm or more and 150 μm or less, and the taper angle is 100° or more and 125° or less.

For obtaining an optical semiconductor device which can further suppress generation of optical noise, and includes an adhesive layer excellent in heat resistance, the optical semiconductor device according to the first embodiment preferably satisfies the following condition I, more preferably satisfies the following condition II, still more preferably satisfies the following condition III, and even more preferably satisfies the following condition IV.

Condition I: The adhesive layer is a cured layer including a cured product of a photosensitive composition, and the photosensitive composition contains a component (A), a photoradical polymerization initiator as a component (B), and a component (C).

Condition II: Condition I is satisfied, and the photosensitive composition further contains a photocationic polymerization initiator as the component (B).

Condition III: Condition II is satisfied, and the component (C) has a (meth)acryloyl group.

Condition IV: Condition IV is satisfied, and the photosensitive composition further contains a reactive diluent.

For obtaining an optical semiconductor device which suppresses generation of optical noise and reflection of foreign matter, is excellent in reliability, and includes an adhesive layer excellent in heat resistance, the optical semiconductor device according to the first embodiment preferably satisfies the conditions 1 and I, more preferably satisfies the conditions 2 and II, still more preferably satisfies the conditions 3 and III, and even more preferably satisfies the conditions 4 and IV.

Uses of Optical Semiconductor Device

The optical semiconductor device according to the first embodiment is used for solid-state imaging devices, light emitting diodes (LEDs), laser diodes, photodiodes, and phototransistors, for example.

The solid-state imaging device (solid-state imaging device having the optical semiconductor device according to the first embodiment) can be applied for the purpose of, for example, sensing light such as visible light, infrared light, ultraviolet light, and X-rays. Examples of the field of application include the fields of appreciation, traffic, home appliances, medical care, security, manufacture, and sports. However, the field of application is not limited to the above-described fields.

For example, in the field of appreciation, the solid-state imaging device can be applied to electronic devices (more specifically, digital cameras, smartphone's cameras, and the like) for capturing an image for appreciation.

For example, in the field of traffic, the solid-state imaging device can be applied to electronic devices for photographing the surroundings, the interior, and the like of an automobile (more specifically, in-vehicle sensors and the like), electronic devices for monitoring traveling vehicles and a road (more specifically, monitoring cameras, and the like), and electronic devices for measuring a distance between vehicles, and the like (more specifically, distance measuring sensors and the like), which are related to advanced driver assist systems, automatic operating systems, and the like mounted in automobiles.

For example, in the field of home appliances, the solid-state imaging device can be applied to electronic devices for photographing a motion or a position of a person to perform device operation, parameter control, and the like based on the motion or the position in home appliances such as television receivers, refrigerators, and air conditioners.

For example, in the field of medical care, the solid-state imaging device can be applied to endoscopes or electronic devices that photograph blood vessels by receiving infrared light.

For example, in the field of security, the solid-state imaging device can be applied to monitoring cameras for crime prevention, cameras for person authentication such as face authentication or iris verification, and the like.

For example, in the field of manufacture, the solid-state imaging device can be applied to electronic devices for performing serial number reading, shape abnormality inspection, filling amount inspection, and the like in a production line of integrated circuit (IC) chips, automobiles, food, pharmaceutical products of the like.

For example, in the field of sports, the solid-state imaging device can be applied to action cameras, wearable cameras, and the like for sports use.

Second Embodiment: Method for Manufacturing Optical Semiconductor Device

Next, a method for manufacturing an optical semiconductor device according to the second embodiment of the present invention will be described with reference to the drawings as appropriate. The method for manufacturing an optical semiconductor device according to the second embodiment is a preferred method for manufacturing the optical semiconductor device according to the first embodiment. In the following description, descriptions of contents overlapping with those of the first embodiment may be omitted.

The method for manufacturing an optical semiconductor device according to the second embodiment includes an adhesive layer forming step, a lamination step, and a curing step. In the adhesive layer forming step, a patterned adhesive layer is formed on a transparent substrate. In the lamination step, the transparent substrate on which the adhesive layer is formed and a semiconductor substrate provided with a light receiving element are laminated in such a manner that a surface of the transparent substrate on which the adhesive layer is formed and a surface of the semiconductor substrate on which the light receiving element is provided face each other. In the laminating step, the transparent substrate and the semiconductor substrate are laminated with the adhesive layer interposed therebetween. In the curing step, the adhesive layer is cured to bond the transparent substrate and the semiconductor substrate. In the method for manufacturing an optical semiconductor device according to the second embodiment, the adhesive layer is disposed on the periphery of the light receiving element in the lamination step. The refractive index of the cured adhesive layer is 1.60 or less. According to the method for manufacturing an optical semiconductor device according to the second embodiment, it is possible to easily manufacture the optical semiconductor device according to the first embodiment.

Hereinafter, as a specific example of the method for manufacturing an optical semiconductor device according to the second embodiment, an example of a method for manufacturing an optical semiconductor device 10 shown in FIG. 1 (hereinafter, sometimes referred to as a "manufacturing method M1") and an example of a method for manufacturing an optical semiconductor device 100 shown in FIG. 3 (hereinafter, sometimes referred to as a "manufacturing method M2") will be each described with reference to the drawings.

[Manufacturing Method M1]

Figure 7:
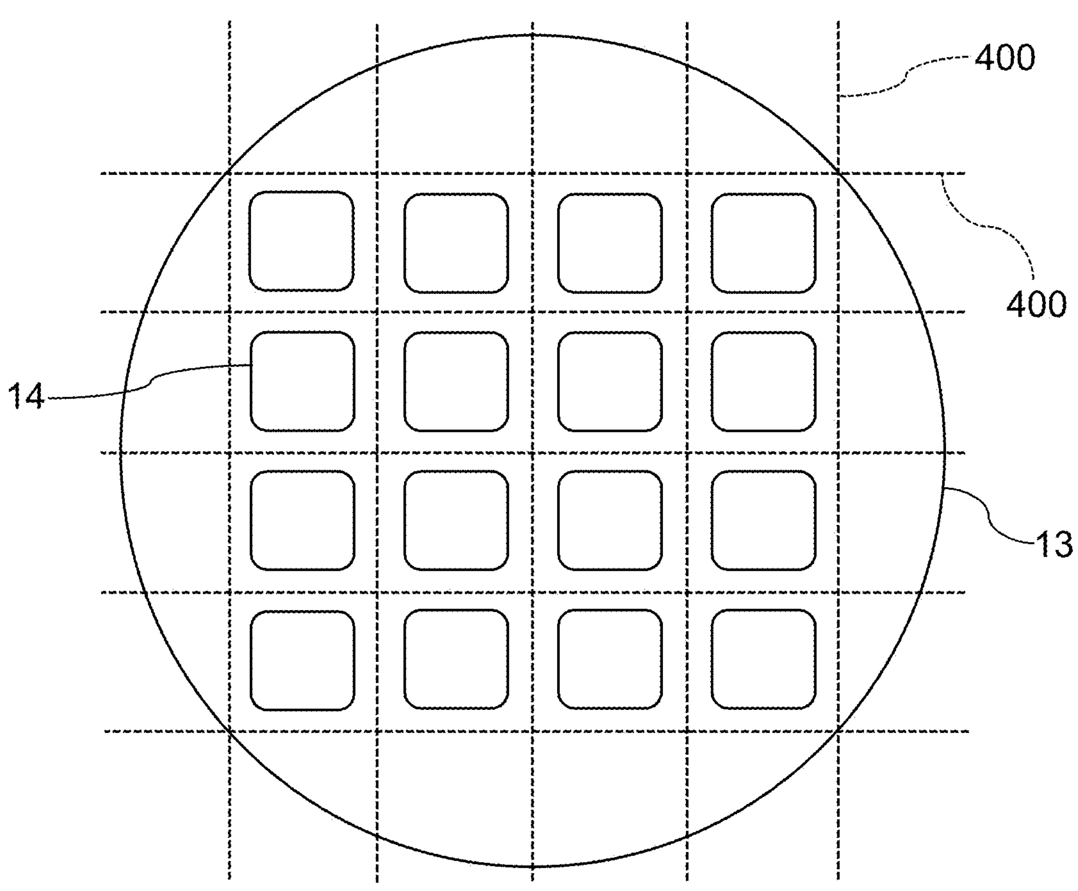
FIG. 7 is a plan view showing a transparent substrate after formation of an adhesive layer in manufacture of an example of an optical semiconductor device according to the present invention.
Figure 8:
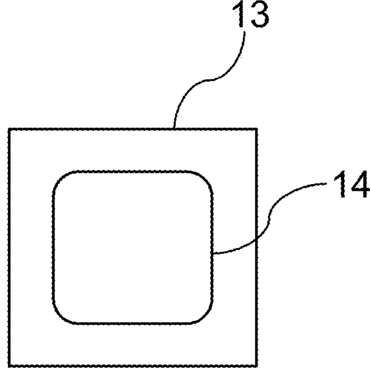
FIG. 8 is a plan view showing a transparent substrate after singulation of an adhesive layer in manufacture of an example of an optical semiconductor device according to the present invention.
Figures 10A, 10B, 10C:
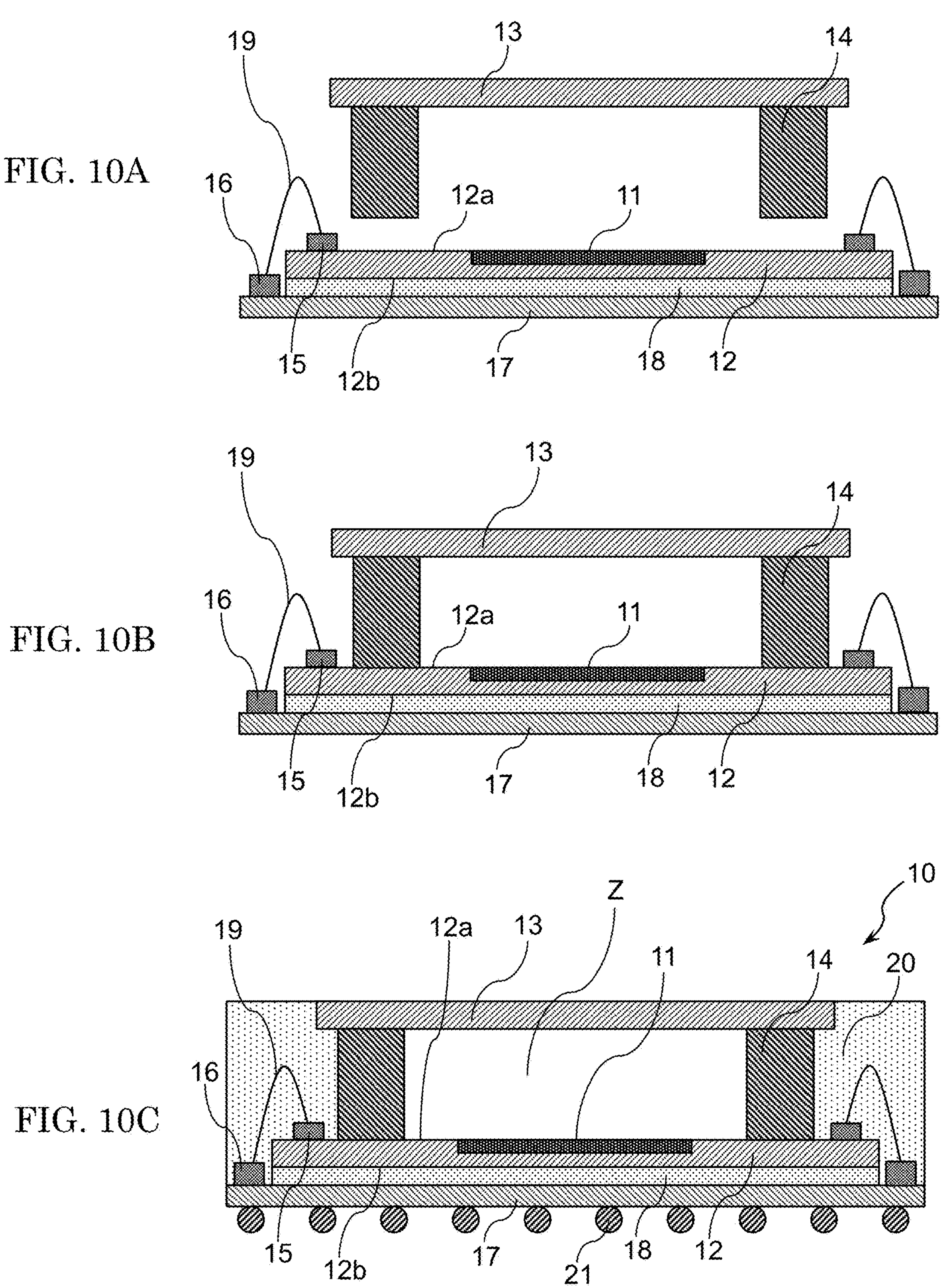
FIGS. 10A, 10B, and 10C are step-by-step sectional views showing an example of a lamination step and a curing step in manufacture of an optical semiconductor device according to the present invention.

First, the manufacturing method M1 will be described with reference to FIGS. 7 to 10C. FIG. 7 is a plan view showing a transparent substrate after formation of an adhesive layer (large-sized transparent substrate) in manufacture of the optical semiconductor device by the manufacturing method M1. FIG. 8 is a plan view showing a transparent substrate after singulation in manufacture of the optical semiconductor device by the manufacturing method M1. FIGS. 9A to 9C are step-by-step sectional views showing the adhesive layer forming step in the manufacturing method M1. FIGS. 10A to 10C are step-by-step sectional views showing the lamination step and the curing step in the manufacturing method M1.

In the manufacturing method M1, first, the adhesive layer 14 in a semi-cured state is formed on a large-sized transparent substrate 13 in a state of being patterned such that a large number of quadrangle-cylindrical shapes are arranged (FIG. 7). Hereinafter, the adhesive layer in a semi-cured state may be referred to as a "semi-cured adhesive layer." The term "semi-cured state" refers to a state in which there is room for further progression of curing of the adhesive layer in the curing step described later. After the semi-cured adhesive layer 14 is formed on the transparent substrate 13, the transparent substrate 13 is diced along a division line 400 of FIG. 7 to singulate the transparent substrate 13 on which the semi-cured adhesive layer 14 is formed (FIG. 8). In dicing, for example, the large-sized transparent substrate 13 is bonded to a dicing tape (not shown) to be fixed, and is cut with a dicing blade (not shown). Here, a surface of the transparent substrate 13 on a side opposite to a surface on which the semi-cured adhesive layer 14 is formed may be bonded to the dicing tape, or the surface on which semi-cured adhesive layer 14 is formed may be bonded to the dicing tape.

In the step of forming the semi-cured adhesive layer 14 on the large-sized transparent substrate 13 (adhesive layer forming step), for example, a film formed of a photosensitive composition (specifically, a coating film formed of a photosensitive composition after heating) is patterned in a semi-cured state by photolithography. The photolithography enables formation of a large number of semi-cured adhesive layers 14 excellent in dimensional accuracy.

A method for forming the semi-cured adhesive layer 14 by photolithography will be described with reference to FIGS. 9A to 9C. First, a photosensitive composition is applied onto the transparent substrate 13 to form a film (coating film) formed of the photosensitive composition. The method for application here is not particularly limited, and for example, a general application method such as a spin coating method, or a slit coating method can be used. Subsequently, the coating film is heated to remove the solvent in the coating film, so that a thin film 401 (coating film after heating) is formed on the transparent substrate 13 (FIG. 9A). The temperature for heating the coating film can be appropriately set, and is preferably 60° C. or higher and 200° C. or lower.

Subsequently, a photomask 402 having a translucent region 402$a$ formed at a predetermined position is disposed on the thin film 401, and the thin film 401 is irradiated with active energy ray E (FIG. 9B). In this way, only the thin film 401 (exposed portion 401$a$) located below the translucent region 402$a$ is exposed, and undergoes a photocuring reaction. The integrated exposure amount during exposure is not particularly limited, and is preferably 1 $mJ/cm^2$ or more and 8,000 $mJ/cm^2$ or less, more preferably 3 $mJ/cm^2$ or more and 3,000 $mJ/cm^2$ or less.

In exposure of the thin film 401, it is preferable to expose the thin film 401 through blue plate glass. When the thin film 401 is exposed through blue plate glass, light having a short wavelength and high activity on the photopolymerization initiator can be cut, and reactive groups remain in the surface layer of the thin film 401, so that the thin film is softened. In this way, the semi-cured adhesive layer 14 having adhesion to the semiconductor substrate 12 (see FIG. 10A) can be easily formed. Examples of the method for exposing the thin film 401 through blue plate glass include a method using a photomask 402 made of blue plate glass, and a method in which the thin film 401 is irradiated with an active energy ray E with the photomask 402 and the blue plate glass stacked one on top of another.

After the exposure, a curing reaction may be allowed to proceed while the semi-cures state of the thin film 401 is maintained by performing baking at a predetermined temperature if necessary.

Subsequently, the exposed thin film 401 is developed. The method for developing the thin film 401 is not particularly limited. For example, an alkaline developer is brought into contact with the thin film 401 by an immersion method or a spray method to dissolve and remove a non-exposed portion 401*b*, thereby forming the patterned semi-cured adhesive layer 14 on the transparent substrate 13 (FIG. 9C). The alkaline developer is not particularly limited, and may be one that is commonly used. Specific examples of the alkaline developer include organic alkali aqueous solutions such as a tetramethylammonium hydroxide (TMAH) aqueous solution or a choline aqueous solution, and inorganic alkali aqueous solutions such as a potassium hydroxide aqueous solution, a sodium hydroxide aqueous solution, a potassium carbonate aqueous solution, a sodium carbonate aqueous solution, and a lithium carbonate aqueous solution. From the viewpoint of increasing the contrast between the exposed portion 401*a* and the non-exposed portion 401*b*, the alkali concentration is preferably 25 wt % or less, more preferably 10 wt % or less, still more preferably 5 wt % or less. For the purpose of, for example, adjusting the dissolution rate, an alcohol or a surfactant may be blended in the alkaline developer. The thin film 401 may be washed with water and dried after the thin film 401 is brought into contact with the alkaline developer.

When the thin film 401 formed of a photoradically polymerizable photosensitive composition is exposed, radical polymerization of the non-exposed portion 401*b* adjacent to the exposed portion 401*a* is likely to be suppressed due to oxygen inhibition in a region of the exposed portion 401*a*, which is relatively close to the photomask 402. On the other hand, when the thin film 401 formed of a photoradically polymerizable photosensitive composition is exposed, a region of the exposed portion 401*a*, which is relatively far from the photomask 402, is hardly influenced by oxygen inhibition, and therefore, in this region, radical polymerization of the non-exposed portion 401*b* adjacent to the exposed portion 401*a* is unlikely to be suppressed. For this reason, when the thin film 401 formed of a photoradically polymerizable photosensitive composition is patterned by photolithography, the width of the semi-cured adhesive layer 14 after development tends to be larger on the transparent substrate 13 side than on a side opposite to the transparent substrate 13 (surface layer side). Thus, when the thin film 401 formed of a photoradically polymerizable photosensitive composition is patterned by photolithography, the taper angle can be made larger than 90°. The taper angle can be adjusted by, for example, changing at least one of the interval G between the thin film 401 and the photomask 402 (see FIG. 9B) and the integrated exposure amount. The interval G is, for example, 50 μm or more and 2,000 μm or less.

As described above, for easily adjusting the taper angle to 95° or more, it is preferable that the photosensitive composition applied onto the transparent substrate 13 contains the component (A), the component (B), and the component (C), with the component (B) being a photoradical polymerization initiator.

Next, the step of laminating the singulated transparent substrate 13 on which the semi-cured adhesive layer 14 is formed (see FIG. 8) and the semiconductor substrate 12 (lamination step) will be described. First, a semiconductor substrate laminated product is provided. As the semiconductor substrate laminated product, a laminated product can be used in which as shown in FIG. 10A, the semiconductor substrate 12 provided with the light receiving element 11 and the wiring substrate 17 are bonded with the die bond material 18 interposed therebetween, and the semiconductor substrate electrode pad 15 and the wiring substrate electrode pad 16 are electrically connected through the wire 19.

As shown in FIG. 10A, the transparent substrate 13 on which the semi-cured adhesive layer 14 is formed and the semiconductor substrate laminated product are disposed in such a manner that a surface of the transparent substrate 13 on which the semi-cured adhesive layer 14 is formed and a surface of the semiconductor substrate 12 on which the light receiving element 11 is provided faces each other, followed by lamination of the transparent substrate 13 and the semiconductor substrate laminated product (FIG. 10B). In the lamination step, the semi-cured adhesive layer 14 is disposed on the periphery of the light receiving element 11.

Next, the curing step will be described. First, the laminate obtained in the lamination step is heated while, for example, a load is applied thereto, so that the transparent substrate 13 and the semiconductor substrate laminated product are thermocompression-bonded. The heating temperature here is, for example, 80° C. or higher and 200° ° C. or lower. The laminate after thermocompression bonding is heated at a temperature of, for example, 100° C. or higher and 300° C. or lower. Through the curing step, the semi-cured adhesive layer 14 is cured, and the transparent substrate 13 and the semiconductor substrate 12 are bonded with the adhesive layer 14 interposed therebetween. Subsequently, as shown in FIG. 10C, the peripheral portion of the adhesive layer 14 (a region including the wire 19) is sealed with the sealing resin 20, and the solder ball 21 is formed on a surface of the wiring substrate 17 on a side opposite to the semiconductor substrate 12 to obtain the optical semiconductor device 10.

In the manufacturing method M1, the semi-cured adhesive layer 14 is formed on the transparent substrate 13, but the semi-cured adhesive layer 14 may be formed on the semiconductor substrate 12, with the lamination step and the curing step being carried out in the same procedure as described above.

[Manufacturing Method M2]

Figure 11:
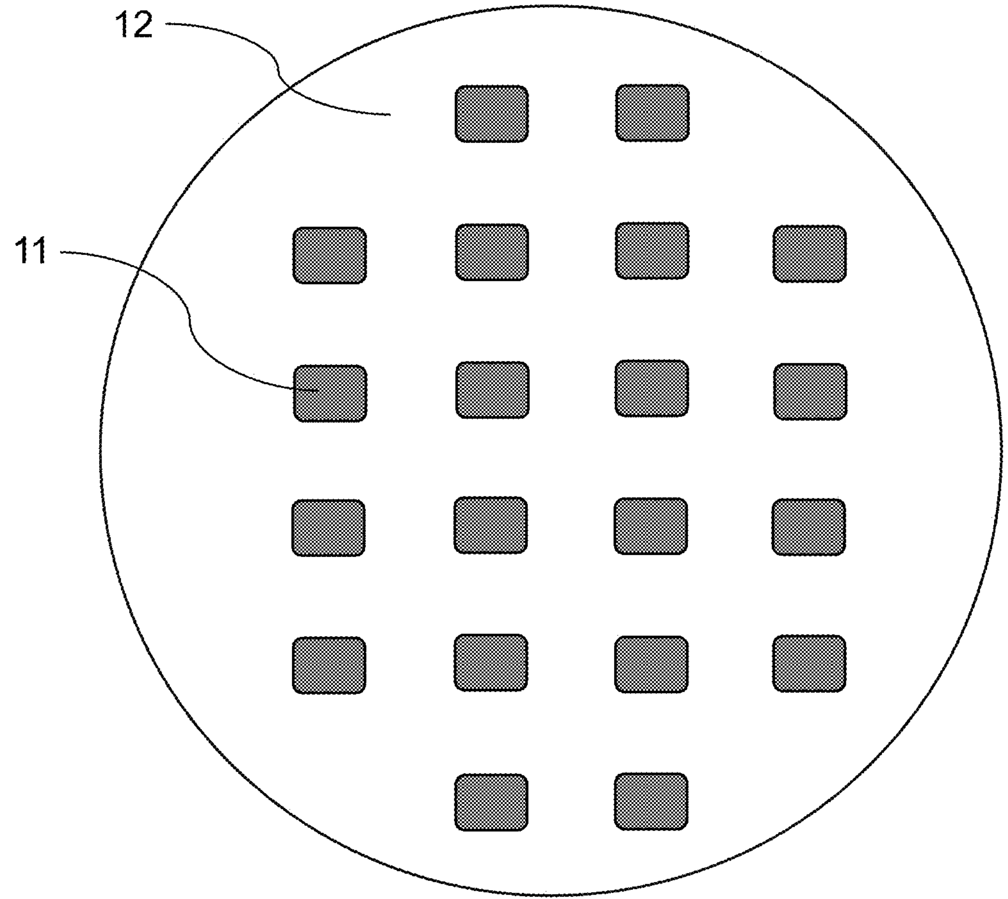
FIG. 11 is a plan view showing a semiconductor substrate after formation of a light receiving element in manufacture of an example of an optical semiconductor device according to the present invention.
Figure 12A:
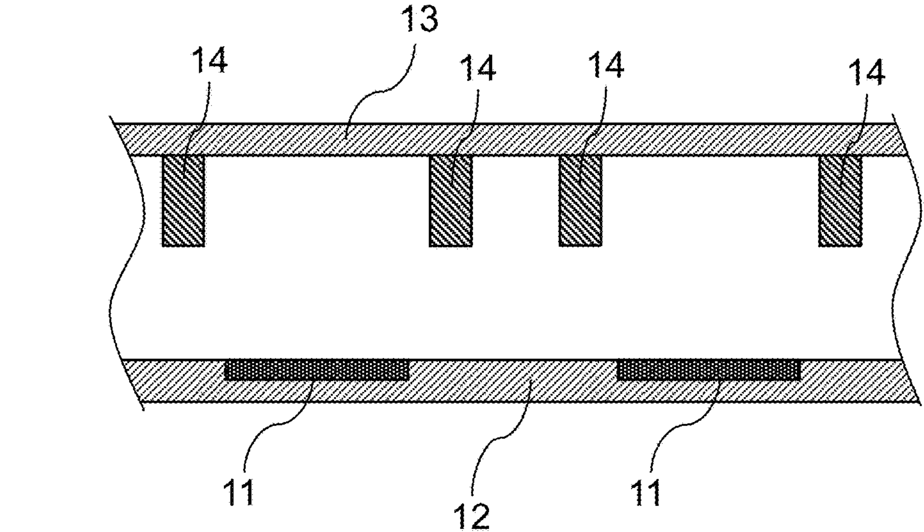
FIGS. 12A and 12B are step-by-step sectional views showing another example of a lamination step in manufacture of an optical semiconductor device according to the present invention.
Figure 12B:
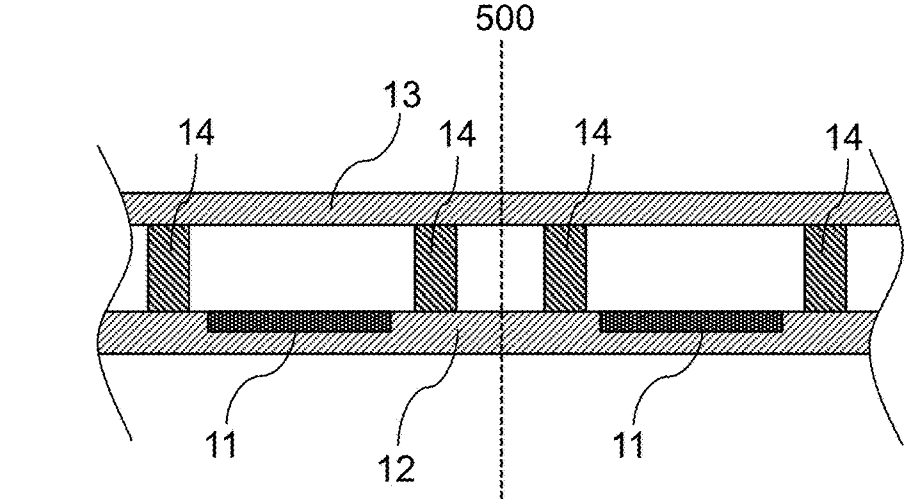

Next, the manufacturing method M2 will be described with reference to FIGS. 7, 11, 12A, and 12B. FIG. 11 is a plan view showing a semiconductor substrate after formation of a light receiving element in manufacture of the optical semiconductor device by the manufacturing method M2. FIGS. 12A to 12B are step-by-step sectional views showing the lamination step in the manufacturing method M2.

In the manufacturing method M2, first, an adhesive layer forming step is carried in the same manner as in the manufacturing method M1. Specifically, in the same manner as in the manufacturing method M1, the semi-cured adhesive layer 14 is formed on a large-sized transparent substrate 13 in a state of being patterned such that a large number of quadrangle-cylindrical shapes are arranged (see FIG. 7). Separately, the large-sized semiconductor substrate 12 (see FIG. 11) provided with a plurality of light receiving elements 11 is provided.

Next, the lamination step will be described. As shown in FIG. 12A, the large-sized transparent substrate 13 on which the semi-cured adhesive layer 14 is formed and the large-sized semiconductor substrate 12 provided with the plurality of light receiving elements 11 are disposed in such a manner that a surface of the transparent substrate 13 on which the semi-cured adhesive layer 14 is formed and a surface of the semiconductor substrate 12 on which the light receiving element 11 is provided face each other, followed by lamination of the transparent substrate 13 and the semiconductor substrate 12 (FIG. 12B). In the lamination step, the semi-cured adhesive layer 14 is disposed on the periphery of the light receiving element 11.

Next, the curing step will be described. First, the laminate obtained in the lamination step is heated while, for example, a load is applied thereto, so that the transparent substrate 13 and the semiconductor substrate 12 are thermocompression-bonded. The heating temperature here is, for example, 80° C. or higher and 200° ° C. or lower. The laminate after thermocompression bonding is heated at a temperature of, for example, 100° C. or higher and 300° C. or lower. Through the curing step, the semi-cured adhesive layer 14 is cured, and the transparent substrate 13 and the semiconductor substrate 12 are bonded with the adhesive layer 14 interposed therebetween.

Subsequently, dicing is performed along a division line 500 in FIG. 12B, and the solder ball 21 is formed on a surface of the semiconductor substrate 12 on a side opposite to the transparent substrate 13 to obtain the optical semiconductor device 100 shown in FIG. 3.

In the manufacturing method M2, the semi-cured adhesive layer 14 is formed on the transparent substrate 13, but the semi-cured adhesive layer 14 may be formed on the semiconductor substrate 12, with the lamination step and the curing step being carried out in the same procedure as described above. Alternatively, using the singulated semiconductor substrate 12 and the singulated transparent substrate 13, the lamination step and the curing step may be carried out in the same procedure as described above.

Other Methods for Forming Adhesive Layer

While the method for manufacturing an optical semiconductor device according to the second embodiment has been described above, the method for manufacturing the optical semiconductor device according to the first embodiment described above is not limited to the manufacturing method according to the second embodiment. The adhesive layer may be formed by, for example, a screen printing method or 3D printing.

[Screen Printing Method]

When the adhesive layer is formed by a screen printing method, it is preferable that the photosensitive composition used has thixotropy from the viewpoint of shape retainability after printing. A photosensitive composition containing fine particles or the like can also be used for the development of thixotropy.

Figure 13:
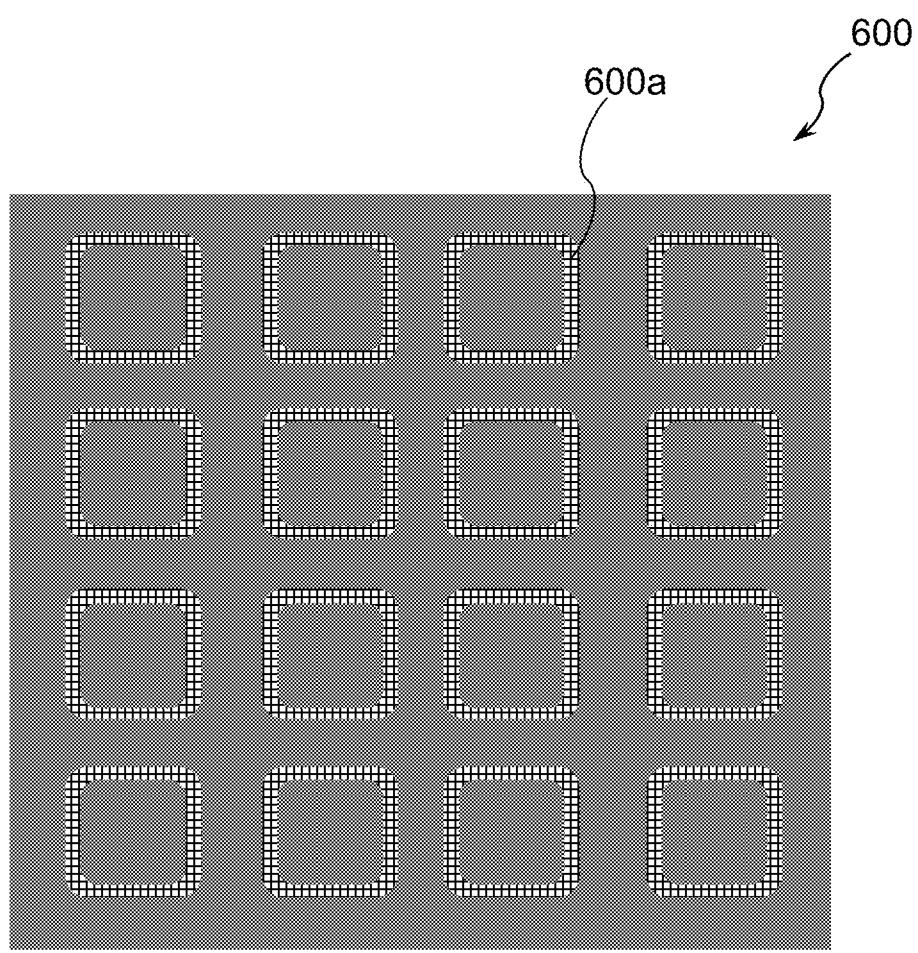
FIG. 13 is a plan view showing an example of a printing mask used in formation of an adhesive layer by a screen printing method.

As the printing mask used in the screen printing method, a printing mask 600 having meshes in a plurality of openings 600*a* as shown in FIG. 13 is preferable. The openings 600*a* are formed in a frame shape for forming an adhesive layer having a quadrangle-cylindrical structure. The number of meshes (number of meshes/inch) of the printing mask 600 is not particularly limited, and is preferably 50 meshes/inch or more and 500 meshes/inch or less. Portions other than the openings 600*a* are solidified with an emulsifier or covered with metal. This ensures that the photosensitive composition can pass through only the openings 600*a*.

In application of the photosensitive composition by screen printing, a printing mask is installed on the transparent substrate with a predetermined clearance, and the photosensitive composition is applied onto the transparent substrate at a predetermined printing rate (squeegee rate). The clearance, the squeegee printing pressure, the squeegee angle, and the squeegee rate can be appropriately set so as to obtain a desired thickness and shape. The screen printing may be performed at atmospheric pressure or under a vacuum.

After the screen printing, the transparent substrate on which the adhesive layer is formed is irradiated with light in a predetermined integrated exposure amount, so that curing proceeds. It is preferable to maintain the adhesive layer in a semi-cured state for securing adhesiveness. Here, it is preferable to expose the substrate through blue plate glass.

[3D Printing]

The 3D printing refers to additive manufacturing, and is a process of producing a three-dimensional (3D) solid object from a digital file such as computer-aided design (CAD). Specifically, seven types of methods described in ASTM F2792-12a can be used, and the seven types of methods include material jetting method, material extrusion method, powder bed fusion, directed energy deposition, sheet lamination, binder jetting, and vat photopolymerization. Among these seven types of methods, material jetting and material extrusion are preferable because an adhesive layer can be directly formed on a transparent substrate, and material jetting is particularly preferable from the viewpoint that fine processing can be performed using a photosensitive composition.

The material jetting is an inkjet method, and in this method, a process of discharging a liquid photosensitive composition in the form of fine drops from an inkjet nozzle to a transparent substrate and curing the photosensitive composition by exposure is repeated to form a three-dimensional shaped object.

When an adhesive layer is formed by 3D printing, for example, an inkjet nozzle moves in an adhesive layer-formed region on a transparent substrate, and a liquid photosensitive composition is ejected from the inkjet nozzle onto the transparent substrate. The ejected photosensitive composition is exposed to cure the photosensitive composition, so that the adhesive layers are constructed one by one. By repeating this process, multilayering is performed to a desired thickness to form an adhesive layer.

When the adhesive layer is formed by material jetting, a large number of adhesive layers may be formed on a large-sized transparent substrate, or the adhesive layer may be formed on a transparent substrate after singulation.

When an adhesive layer having a shape that is difficult to produce in principle (e.g., a shape with a large degree of hangover in which a layer laminated later protrudes to a large extent in a horizontal direction) is formed, a support material can be used. The material for the support material used is not particularly limited, and may be a photosensitive composition, wax, or a water-soluble material. In the step of forming the adhesive layer, a support material may be used when the taper angle is made smaller than 90° or when irregular shapes are formed on a side surface of the adhesive layer.

When an adhesive layer is formed using a photosensitive composition by 3D printing, it is preferable to maintain the photosensitive composition in a semi-cured state by, for example, adjusting the integrated exposure amount for developing adhesiveness in the subsequent lamination step.

EXAMPLES

Hereinafter, the present invention will be described in more detail by way of examples, but the present invention is not limited to these examples.

Method for Measuring Refractive Index

First, a method for measuring the refractive index of an adhesive layer (a cured layer including a cured product of each photosensitive composition obtained by a preparation method described later) will be described. A glass substrate (specifically, a glass substrate whose surface is coated with Mo (molybdenum) by vacuum vapor deposition) was spin-coated with the photosensitive composition in such a manner that the thickness of the resulting cured layer was 50 μm, thereby forming a coating film on the glass substrate. Subsequently, the coating film was heated at a temperature of 80° C. for 10 minutes, and heated at a temperature of 120° C. for 10 minutes using a hot plate. Subsequently, the heated coating film (thin film) was exposed under the condition of an integrated exposure amount of 1,000 $mJ/cm^2$, and then left to stand in an atmosphere at a temperature of 25° C. for 5 minutes. Subsequently, the thin film left to stand for 5 minutes was heated at a temperature of 120° ° C. for 10 minutes using a hot plate. Subsequently, the heated thin film was peeled from the glass substrate with a cutter knife, and then heated in an oven at a temperature of 200° ° C. for 2 hours to obtain a film-shaped sample (cured layer including a cured product of the photosensitive composition) for use in measurement of the refractive index. The refractive index of the obtained film-shaped sample to light having a wavelength of 404 nm in an atmosphere at a temperature of 23° C. was measured using a prism coupler ("2010/M" manufactured by Metricon). In the measurement of the refractive index, the refractive index of each film-shaped sample was consecutively measured five times in half mode. The arithmetic average value of the obtained five measured values was defined as a "refractive index", which is shown in Table 1 below.

Synthesis of Polymer (Polysiloxane Compound)

Hereinafter, methods for synthesis of polymers P1 and P2 will be described. The weight average molecular weights of polymers P1 and P2 were calculated in terms of standard polystyrene from a chromatogram obtained by measuring the weight average molecular weight at a flow rate of 1.0 mL/min using "HLC-8420GPC" (Column: Shodex GPC KD-806 M (2 columns) and TSKgel SuperAWM-H (2 columns)) manufactured by Tosoh Corporation, and N,N-dimethylformamide as a solvent.

[Synthesis of Polymer P1]

124 mg of a xylene solution of a platinum vinyl siloxane complex ("Pt-VTSC-3X" manufactured by Umicore Precious Metals Japan Co., Ltd., solution with a platinum content of 3 wt %) was added to a mixture of 40 g of diallyl isocyanurate, 29 g of diallyl monomethyl isocyanurate, and 264 g of 1,4-dioxane to obtain a solution S1. Meanwhile, 88 g of 1,3,5,7-tetrahydrogen-1,3,5,7-tetramethylcyclotetrasiloxane was dissolved in 176 g of toluene to obtain a solution S2.

In a nitrogen atmosphere containing 3 vol % of oxygen, the solution S1 was added dropwise to the solution S2 over 3 hours with the solution S2 heated at a temperature of 105° C. After completion of the dropwise addition, the mixture was stirred for 30 minutes while being maintained at a temperature of 105° C., thereby obtaining a solution S3. The reaction ratio of the alkenyl group of the compound contained in the obtained solution S3 was measured by $^1H$-NMR, and the result showed that the reaction ratio was 95% or more.

Meanwhile, 62 g of 1-vinyl-3,4-epoxycyclohexane was dissolved in 62 g of toluene to obtain a solution S4.

In a nitrogen atmosphere containing 3 vol % of oxygen, the solution S4 was added dropwise to the solution S3 over 1 hour with the solution S3 heated at a temperature of 105° C. After completion of the dropwise addition, the mixture was stirred for 30 minutes while being maintained at a temperature of 105° C., thereby obtaining a solution S5. The reaction ratio of the alkenyl group of the compound contained in the obtained solution S5 was measured by 1H-NMR, and the result showed that the reaction ratio was 95% or more.

Subsequently, the solution S5 was cooled, and the solvent (toluene, xylene, and 1,4-dioxane) was then distilled off from the solution S5 under reduced pressure to obtain a polymer P1 (polysiloxane compound having a weight average molecular weight of 30,000). The polymer P1 had a plurality of cationically polymerizable groups (specifically, alicyclic epoxy groups) and a plurality of alkali-soluble groups (specifically, X2 groups) in one molecule, and a cyclic polysiloxane structure in the main chain.

[Synthesis of Polymer P2]

A polymer P2 (polysiloxane compound having a weight average molecular weight of 1,000) was prepared in the same manner as in the synthesis method for the polymer P1 except that the following solutions were used as solutions S1, S2, and S4, respectively.

Solution S1: A solution obtained by adding 87 mg of a xylene solution of a platinum-vinylsiloxane complex ("Pt-VTSC-3X" manufactured by Umicore Precious Metals Japan Co., Ltd., solution with a platinum content of 3 wt %) to a mixture of 50 g of diallyl monomethyl isocyanurate and 100 g of toluene.

Solution S2: A solution obtained by dissolving 94 g of 1,3,5,7-tetrahydrogen-1,3,5,7-tetramethylcyclotetrasiloxane in 186 g of toluene.

Solution S4: A solution obtained by dissolving 55 g of 1-vinyl-3,4-epoxycyclohexane in 55 g of toluene.

The polymer P2 had a plurality of cationically polymerizable groups (specifically, alicyclic epoxy groups) in one molecule, and a cyclic polysiloxane structure in the main chain.

<Preparation of Other Materials>

As materials for the photosensitive composition, the following materials were provided in addition to the above-described polymers.

- "jER (registered trademark) XY8000" manufactured by Mitsubishi Chemical Corporation (hydrogenated bisphenol A type epoxy resin, hereinafter referred to as "XY8000").
- "jER (registered trademark) 828" manufactured by Mitsubishi Chemical Corporation (bisphenol A type epoxy resin, hereinafter referred to as "828").

("CELLOXIDE (registered trademark) 2021P" manufactured by DAICEL CORPORATION) (3',4'-epoxycyclohexylmethyl 3,4-epoxycyclohexanecarboxylate, hereinafter referred to as "2021P").

Pentaerythritol tetraacrylate (manufactured by Tokyo Chemical Industry Co., Ltd., hereinafter referred to as "PETA").

"CPI-210S" manufactured by San-Apro Ltd. (sulfonium salt-based photocationic polymerization initiator, hereinafter referred to as "CPI-210S").

2,2-Dimethoxy-2-phenylacetophenone (photoradical polymerization initiator manufactured by Tokyo Chemical Industry Co., Ltd., hereinafter referred to as "DMPA").

"IRGANOX (registered trademark) 1010" manufactured by BASF SE (antioxidant, hereinafter referred to as "1010").

"R976" manufactured by Nippon Aerosil Co., Ltd. (fumed silica, hereinafter referred to as "R976").

"TTO-55 (S)" manufactured by Ishihara Sangyo Kaisha, Ltd. (titanium oxide fine particles, hereinafter referred to as "TTO-55 (S)").

Bis(2-morpholinoethyl) ether (basic compound manufactured by Tokyo Chemical Industry Co., Ltd., hereinafter referred to as "BME").

Isobutyl isobutyrate (solvent manufactured by Tokyo Chemical Industry Co., Ltd., hereinafter referred to as "IBIB").

Preparation of Photosensitive Composition

The materials shown in Table 1 were blended in the blending amounts shown in Table 1, thereby obtaining photosensitive compositions PS1 to PS5 used in examples and comparative examples. In Table 1, "-" means that the relevant material was not blended. The "refractive index" in Table 1 is a refractive index measured with the photosensitive composition by the method described in <Method for measuring refractive index> using the photosensitive composition.

TABLE 1

| Photosensitive composition | | PS1 | PS2 | PS3 | PS4 | PS5 |
|---|---|---|---|---|---|---|
| Blending amount of each material (unit: parts by weight) | Polymer P1 | 75 | — | — | — | 75 |
| | Polymer P2 | — | 100 | — | — | — |
| | XY8000 | — | — | 100 | — | — |
| | 828 | — | — | — | 100 | — |
| | 2021P | 7 | 10 | 10 | 10 | 7 |
| | PETA | — | — | — | — | 20 |
| | CPI-210S | 2 | 2 | 2 | 2 | 2 |
| | DMPA | — | — | — | — | 2 |
| | 1010 | 0.5 | 0.5 | 0.5 | 0.5 | 0.5 |
| | R976 | — | 5 | 5 | — | — |
| | TTO-55(S) | — | — | — | 10 | — |
| | BME | 0.15 | — | — | — | 0.15 |
| | IBIB | 28.5 | — | — | — | 26.5 |
| Refractive index | | 1.52 | 1.52 | 1.56 | 1.62 | 1.51 |

Production of Optical Semiconductor Device

Hereinafter, methods for producing optical semiconductor devices in Examples 1 to 22 and Comparative Example 1 will be described.

Example 1

On a glass substrate (10 cm×10 cm, thickness 0.4 mm) which is a transparent substrate, a coating film was formed by applying the photosensitive composition PS1 by a spin coating method. Subsequently, using a hot plate, the glass substrate on which a coating film is formed was heated at 80° C. for 10 minutes, and then at 120° C. for 10 minutes to obtain a glass substrate on which a 50 μm-thick thin film is formed. Through a blue plate glass photomask on which a pattern for forming a plurality of adhesive layers having a quadrangle-cylindrical structure is formed (blue plate glass photomask on which a plurality of frame-shaped translucent regions having a line width of 100 μm is formed), the obtained thin film was exposed under the condition of an integrated exposure amount of 1500 mJ/cm$^2$ using a manual exposure machine ("MA-1300" manufactured by Japan Science Engineering Co., Ltd., lamp: high-pressure mercury lamp). During exposure, the interval G between the thin film and the blue plate glass photomask (see FIG. 9B) was 100 μm.

Subsequently, the exposed thin film was immersed in a TMAH aqueous solution as an alkaline developer (temperature: 23° C., concentration of TMAH: 2.38 wt %) for 3 minutes, and washed with pure water for 1 minute. Thus, the thin film on the glass substrate was patterned to obtain a glass substrate provided with a plurality of semi-cured adhesive layers having a quadrangle-cylindrical structure. Subsequently, a dicing film was temporarily bonded to the surface of the glass substrate on which the semi-cured adhesive layer is not provided, and the glass substrate was then cut between semi-cured adhesive layers with a dicing blade, and the dicing film was peeled off to obtain a singulated glass substrate with a semi-cured adhesive layer (hereinafter, referred to simply as a "glass substrate with a semi-cured adhesive layer").

Next, the obtained glass substrate with a semi-cured adhesive layer and the semiconductor substrate laminated product were laminated to form a laminate. Here, the glass substrate and the semiconductor substrate laminated product were laminated in such a manner that a surface of the semiconductor substrate laminated product on which the light receiving element is provided and a surface of the glass substrate with a semi-cured adhesive layer on which the semi-cured adhesive layer is provided faced each other. As the semiconductor substrate laminated product, a semiconductor substrate laminated product was used in which a semiconductor substrate provided with a light receiving element and a wiring substrate are bonded with a die bond material interposed therebetween, and an electrode pad on the semiconductor substrate and an electrode pad on the wiring substrate are electrically connected through a metallic wire.

Subsequently, a load of 500 g was applied to the laminate of the glass substrate with a semi-cured adhesive layer and the semiconductor substrate laminated product on a hot plate at a temperature of 120° C. for 30 seconds to thermocompression-bond the semiconductor substrate laminated product and the glass substrate with the semi-cured adhesive layer interposed therebetween. Subsequently, the laminate after thermocompression bonding of the semiconductor substrate laminated product and the glass substrate was heated in an oven at a temperature of 200° ° C. for 2 hours to cure the semi-cured adhesive layer. Subsequently, the peripheral portion of the adhesive layer (cured adhesive layer) (a region including the wire) was sealed with a sealing resin, and a solder ball was formed on a surface of the wiring substrate on a side opposite to the semiconductor substrate to obtain an optical semiconductor device of Example 1. The optical semiconductor device of Example 1 had a structure shown in FIG. 1. In the optical semiconductor device of Example 1, the height of the adhesive layer was 50 μm.

Example 2

A glass substrate (10 cm×10 cm, thickness 0.4 mm) which is a transparent substrate was adsorbed under vacuum onto a stage of a screen printer, and a photosensitive composition PS2 was then applied onto a printing mask having 250 meshes per inch (printing mask for forming a plurality of adhesive layers having a quadrangle-cylindrical structure). Subsequently, the printing mask was placed above the glass substrate with a printing height (clearance) of 100 μm therebetween, and the glass substrate was screen-printed with the photosensitive composition PS2 at a printing rate of 30 mm/sec to form a 100 μm-thick printed layer on the glass substrate. Subsequently, using a manual exposure machine ("MA-1300" manufactured by Japan Science Engineering Co., Ltd., lamp: high-pressure mercury lamp), the obtained printed layer was exposed through blue plate glass under the condition of an integrated exposure amount of 1,500 mJ/$cm^2$ to obtain a glass substrate provided with a plurality of semi-cured adhesive layers having a quadrangle-cylindrical structure. Subsequently, a dicing film was temporarily bonded to a surface of the glass substrate on which the semi-cured adhesive layer is not provided, and singulation through to solder ball formation were performed in the same manner as in Example 1 to obtain an optical semiconductor device of Example 2. The optical semiconductor device of Example 2 had a structure shown in FIG. 1.

Example 3

An optical semiconductor device of Example 3 was produced in the same manner as in Example 2 except that the photosensitive composition PS3 was used instead of the photosensitive composition PS2. The optical semiconductor device of Example 3 had a structure shown in FIG. 1.

Examples 4 to 22

Optical semiconductor devices of Examples 4 to 22 were produced in the same manner as in Example 1 except that the types of the photosensitive compositions, the intervals G between the thin film and the blue plate glass photomask used in exposure, and the heights of the adhesive layer were as shown in Table 2 below. The optical semiconductor devices of Examples 4 to 22 all had a structure shown in FIG. 1.

Comparative Example 1

An optical semiconductor device of Comparative Example 1 was produced in the same manner as in Example 2 except that the photosensitive composition PS4 was used instead of the photosensitive composition PS2. The optical semiconductor device of Comparative Example 1 had a structure shown in FIG. 1.

Evaluation of Optical Semiconductor Device

[Visual Evaluation]

First, it was confirmed that the optical semiconductor devices of Examples 1 to 22 and Comparative Example 1 obtained by the above-described procedure operated as optical semiconductor devices without problem. Subsequently, for these optical semiconductor devices, captured images were visually observed to evaluate imaging performance. In Comparative Example 1 with the adhesive layer having a refractive index of more than 1.60, ghosts and flares were observed, whereas in Examples 1 to 22 with the adhesive layer having a refractive index of 1.60 or less, either ghosts or flares were not generated.

[Evaluation by Ghost Index]

First, for an optical semiconductor device to be evaluated (any of Examples 1 and 4 to 22), the number of pixels exceeding a predetermined threshold value (1/100 million of the brightness of a light source) (hereinafter, referred to as a "number of abnormal pixels") was determined using a ghost flare evaluation system ("GCS-2T" manufactured by TSUBOSAKA ELECTRIC Co., Ltd.), and the number of abnormal pixels was divided by the number of all pixels to calculate the value of the number of abnormal pixels/the number of all pixels. Hereinafter, the value obtained by dividing the number of abnormal pixels by the number of all pixels (the number of abnormal pixels/the number of all pixels) may be referred to as an abnormal pixel number ratio.

Then, the abnormal pixel number ratio in Example 1 was defined as 100, the ratio of each of the numbers of abnormal pixels in Examples 4 to 22 was normalized, and the normalized value (hereinafter, referred to as a "ghost index") was used as an index of performance enabling suppression of generation of ghosts. It was determined that the smaller the ghost index, the higher the performance enabling suppression of generation of ghosts.

[Evaluation of Reliability by Thermal Shock Test]

First, using a heat shock tester ("COSMOPIA (registered trademark) S" manufactured by Hitachi Johnson Controls Air Conditioning Inc.), an operation in which an optical semiconductor device to be evaluated (any of Examples 1 and 4 to 22) is held in an atmosphere at −50° C. for 30 minutes and then in an atmosphere at 125° C. for 30 minutes was carried out 500 times. Subsequently, the optical semiconductor device was observed from the glass substrate side with an optical microscope, and the number of cracked portions of the adhesive layer and the number of peeled portions of the adhesive layer were counted. The reliability was evaluated on the basis of the following criteria. A sample rated "A" was evaluated as being "excellent in reliability." On the other hand, a sample rated "B" was evaluated as being "not excellent in reliability."

(Evaluation Criteria for Reliability)

A: The sum of the number of cracked portions of the adhesive layer and the number of peeled portions of the adhesive layer is less than 10.

B: The sum of the number of cracked portions of the adhesive layer and the number of peeled portions of the adhesive layer is 10 or more.

Table 2 shows the types of photosensitive compositions used, the intervals between the thin film and the blue plate glass photomask during exposure, the taper angles, the heights of the adhesive layer, the ghost indices, and the results of evaluation of reliability for Examples 1 and 4 to 22. Each of the taper angles and the heights of the adhesive layer is an arithmetic average of values obtained from an electron microscope image of a cross-section obtained by cutting the optical semiconductor device in the thickness direction (the number of samples: 5). In Table 2, the "interval G" is an interval between the thin film and the blue plate glass photomask during exposure.

TABLE 2

| | Type of photosensitive composition | Interval G [μm] | Height of adhesive layer [μm] | Taper angle [°] | Ghost index | Result of evaluation of reliability |
|---|---|---|---|---|---|---|
| Example 1 | PS1 | 100 | 50 | 80 | 100 | A |
| Example 4 | PS1 | 300 | 50 | 85 | 96 | A |
| Example 5 | PS1 | 600 | 50 | 90 | 88 | A |
| Example 6 | PS5 | 200 | 50 | 95 | 79 | A |
| Example 7 | PS5 | 400 | 50 | 100 | 76 | A |
| Example 8 | PS5 | 600 | 50 | 110 | 74 | A |
| Example 9 | PS5 | 800 | 50 | 120 | 71 | A |
| Example 10 | PS5 | 1000 | 50 | 130 | 68 | B |
| Example 11 | PS1 | 600 | 30 | 90 | 84 | A |
| Example 12 | PS5 | 400 | 30 | 100 | 73 | A |
| Example 13 | PS5 | 600 | 30 | 110 | 70 | A |
| Example 14 | PS5 | 800 | 30 | 120 | 67 | A |
| Example 15 | PS1 | 600 | 100 | 90 | 90 | A |
| Example 16 | PS5 | 400 | 100 | 100 | 78 | A |
| Example 17 | PS5 | 600 | 100 | 110 | 76 | A |
| Example 18 | PS5 | 800 | 100 | 120 | 74 | A |
| Example 19 | PS1 | 600 | 150 | 90 | 91 | A |
| Example 20 | PS5 | 400 | 150 | 100 | 80 | A |
| Example 21 | PS5 | 600 | 150 | 110 | 78 | A |
| Example 22 | PS5 | 800 | 150 | 120 | 76 | A |

As shown in Table 2, the optical semiconductor devices of Example 5 to 22 in which the taper angle was 90° or more and 130° or less had a smaller ghost index and higher performance enabling suppression of generation of ghosts as compared to the optical semiconductor devices of Examples 1 and 4 in which the taper angle was less than 90°.

DESCRIPTION OF REFERENCE CHARACTERS

10, 100, 300 optical semiconductor device
11 light receiving element
12 semiconductor substrate
13 transparent substrate
14 adhesive layer
15 semiconductor substrate electrode pad (electrode pad)
17 wiring substrate

The invention claimed is:

1. An optical semiconductor device comprising:
- a semiconductor substrate provided with a light receiving element;
- a transparent substrate facing a surface of the semiconductor substrate on which the light receiving element is provided; and
- an adhesive layer that bonds the semiconductor substrate and the transparent substrate, wherein
- the adhesive layer is provided so as to surround the light receiving element,
- the adhesive layer has a refractive index of 1.60 or less, and
- an angle formed by a surface of the transparent substrate on the semiconductor substrate side and an inner wall surface of the adhesive layer is more than 90°.

2. The optical semiconductor device according to claim 1, wherein the angle formed by the surface of the transparent substrate on the semiconductor substrate side and the inner wall surface of the adhesive layer is more than 90° and 130° or less.

3. The optical semiconductor device according to claim 1, wherein a height of the adhesive layer is 15 μm or more and 300 μm or less.

4. The optical semiconductor device according to claim 1, further comprising a wiring substrate provided on the semiconductor substrate on a side opposite to the transparent substrate.

5. The optical semiconductor device according to claim 4, wherein the semiconductor substrate is provided with an electrode pad, and the adhesive layer is disposed between the electrode pad and the light receiving element.

6. The optical semiconductor device according to claim 1, the optical semiconductor device being of chip size package type.

7. The optical semiconductor device according to claim 1, wherein the adhesive layer includes a cured layer including a cured product of a photosensitive composition.

8. The optical semiconductor device according to claim 7, wherein the photosensitive composition contains a polysiloxane compound and a photopolymerization initiator, and the polysiloxane compound has a cationically polymerizable group and an alkali-soluble group in one molecule.

9. The optical semiconductor device according to claim 8, wherein the cationically polymerizable group is one or more selected from the group consisting of a glycidyl group, an alicyclic epoxy group, and an oxetanyl group.

10. The optical semiconductor device according to claim 8, wherein the alkali-soluble group is one or more selected from the group consisting of a monovalent organic group represented by the following chemical formula X1 and a divalent organic group represented by the following chemical formula X2

(X1)

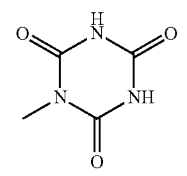

(X2)

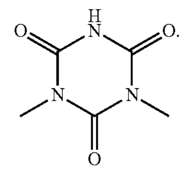

11. The optical semiconductor device according to claim 8, wherein the photosensitive composition further contains a compound having a radically polymerizable group, and contains a photoradical polymerization initiator as the photopolymerization initiator.

12. A solid-state imaging device comprising the optical semiconductor device according to claim 1.

13. An electronic device comprising the solid-state imaging device according to claim 12.

14. A method for manufacturing an optical semiconductor device, comprising:

forming a patterned adhesive layer on a transparent substrate;

laminating the transparent substrate on which the adhesive layer is formed and a semiconductor substrate provided with a light receiving element in such a manner that a surface of the transparent substrate on which the adhesive layer is formed and a surface of the semiconductor substrate on which the light receiving element is provided face each other; and curing the adhesive layer to bond the transparent substrate and the semiconductor substrate, wherein the adhesive layer is disposed on a periphery of the light receiving element in lamination of the transparent substrate and the semiconductor substrate, a refractive index of the cured adhesive layer is 1.60 or less, and in formation of the patterned adhesive layer, a film formed of a photosensitive composition is patterned in a semi-cured state by photolithography.

15. The method for manufacturing an optical semiconductor device according to claim 14, wherein in formation of the patterned adhesive layer, the film formed of the photosensitive composition is exposed through blue plate glass, and then the exposed film is developed.

16. The method for manufacturing an optical semiconductor device according to claim 14, wherein the photosensitive composition contains a polysiloxane compound, a photoradical polymerization initiator, and a compound having a radically polymerizable group, and the polysiloxane compound has a cationically polymerizable group and an alkali-soluble group in one molecule.

17. A method for manufacturing an optical semiconductor device, comprising:

forming a patterned adhesive layer on a transparent substrate;

laminating the transparent substrate on which the adhesive layer is formed and a semiconductor substrate provided with a light receiving element in such a manner that a surface of the transparent substrate on which the adhesive layer is formed and a surface of the semiconductor substrate on which the light receiving element is provided face each other; and curing the adhesive layer to bond the transparent substrate and the semiconductor substrate, wherein the adhesive layer is disposed on a periphery of the light receiving element in lamination of the transparent substrate and the semiconductor substrate, a refractive index of the cured adhesive layer is 1.60 or less, and an angle formed by a surface of the transparent substrate on the semiconductor substrate side and an inner wall surface of the adhesive layer is more than 90°.

* * * * *